(12) United States Patent
Ossimitz et al.

(10) Patent No.: US 9,385,059 B2
(45) Date of Patent: Jul. 5, 2016

(54) OVERMOLDED SUBSTRATE-CHIP ARRANGEMENT WITH HEAT SINK

(71) Applicant: Infineon Technologies AG, Neubiberg (DE)

(72) Inventors: Peter Ossimitz, Munich (DE); Juergen Schaefer, Oberhaching (DE); Liu Chen, Munich (DE); Markus Dinkel, Unterhaching (DE); Stefan Macheiner, Kissing (DE)

(73) Assignee: Infineon Technologies AG, Neubiberg (DE)

( * ) Notice: Subject to any disclaimer, the term of this patent is extended or adjusted under 35 U.S.C. 154(b) by 227 days.

(21) Appl. No.: 14/011,772

(22) Filed: Aug. 28, 2013

(65) Prior Publication Data

US 2015/0062825 A1 Mar. 5, 2015

(51) Int. Cl.
| | |
|---|---|
| *H05K 7/20* | (2006.01) |
| *H01L 23/34* | (2006.01) |
| *H01L 21/48* | (2006.01) |
| *H05K 3/32* | (2006.01) |
| *H01L 23/367* | (2006.01) |
| *H01L 23/40* | (2006.01) |
| *H05K 3/28* | (2006.01) |
| *H05K 5/00* | (2006.01) |
| *H01L 23/31* | (2006.01) |
| *H01L 23/427* | (2006.01) |

(Continued)

(52) U.S. Cl.
CPC ............ *H01L 23/34* (2013.01); *H01L 21/4882* (2013.01); *H01L 23/367* (2013.01); *H01L 23/4006* (2013.01); *H01L 23/4093* (2013.01); *H05K 3/284* (2013.01); *H05K 3/32* (2013.01); *H05K 5/0034* (2013.01); *H01L 23/3128* (2013.01); *H01L 23/3675* (2013.01); *H01L 23/427* (2013.01); *H01L 23/49822* (2013.01); *H01L 2023/405* (2013.01); *H01L 2224/16225* (2013.01); *H01L 2924/0002* (2013.01); *H01L 2924/13055* (2013.01); *H05K 1/0206* (2013.01); *H05K 1/0209* (2013.01); *H05K 2201/10166* (2013.01); *Y10T 29/49146* (2015.01)

(58) Field of Classification Search
CPC ... H01L 23/34; H01L 23/4093; H01L 23/367; H01L 23/4006; H01L 21/4882; H01L 2924/13055; H01L 2224/16225; H01L 2924/0002; H01L 23/49822; H01L 23/427; H01L 23/3675; H01L 2023/405; H01L 23/3128; H05K 5/0034; H05K 3/284; H05K 3/32; H05K 1/0206; H05K 1/0209; H05K 2201/10166; Y10T 29/49146
USPC .................................................. 361/688–723
See application file for complete search history.

(56) References Cited

U.S. PATENT DOCUMENTS 6,307,749 B1 * 10/2001 Daanen .................. H05K 3/284
174/50.5
6,779,260 B1 * 8/2004 Brandenburg ...... H01L 23/3121
174/541

(Continued)

*Primary Examiner* — Anthony Haughton
*Assistant Examiner* — Yahya Ahmad

(57) ABSTRACT

An electronic device comprises a substrate, at least one electronic chip mounted on and electrically connected to the substrate and being configured as a system control unit for controlling a connected system, a heat removal structure thermally connected to the at least one electronic chip and configured for removing heat generated by the at least one electronic chip upon operation of the electronic device, and an overmolding structure configured for at least partially encapsulating at least the at least one electronic chip and the substrate.

19 Claims, 16 Drawing Sheets

(51) Int. Cl.
*H01L 23/498* (2006.01)
*H05K 1/02* (2006.01)

(56) References Cited

U.S. PATENT DOCUMENTS

| | | | | |
|---|---|---|---|---|
| 2003/0184969 A1* | 10/2003 | Itabashi | H05K 1/0206 | 361/688 |
| 2004/0004819 A1* | 1/2004 | Wong | H01L 23/13 | 361/707 |
| 2004/0132322 A1* | 7/2004 | Brandenburg | H01R 13/719 | 439/75 |
| 2005/0190539 A1* | 9/2005 | Watanabe | H05K 7/20854 | 361/704 |
| 2006/0012034 A1* | 1/2006 | Kadoya | H05K 1/0203 | 257/712 |
| 2010/0202110 A1* | 8/2010 | Becker | H05K 5/0082 | 361/707 |
| 2011/0007478 A1* | 1/2011 | Takahashi | H01L 23/3121 | 361/721 |
| 2012/0006514 A1* | 1/2012 | Bratkovski | H01L 23/367 | 165/121 |
| 2012/0217983 A1* | 8/2012 | Sinha | G01N 27/041 | 324/697 |
| 2015/0009629 A1* | 1/2015 | Moon | H05K 5/0034 | 361/709 |
| 2015/0022976 A1* | 1/2015 | Ott | H01L 23/057 | 361/736 |

* cited by examiner

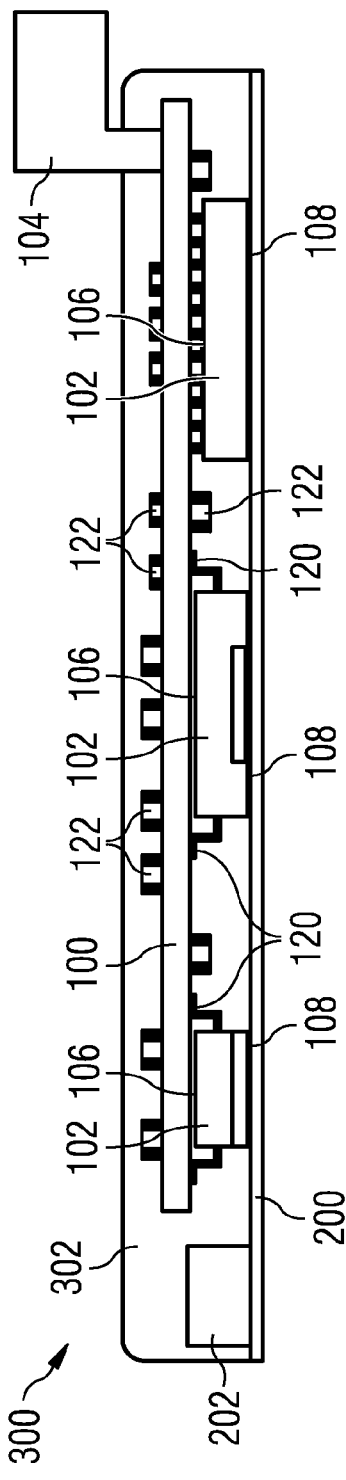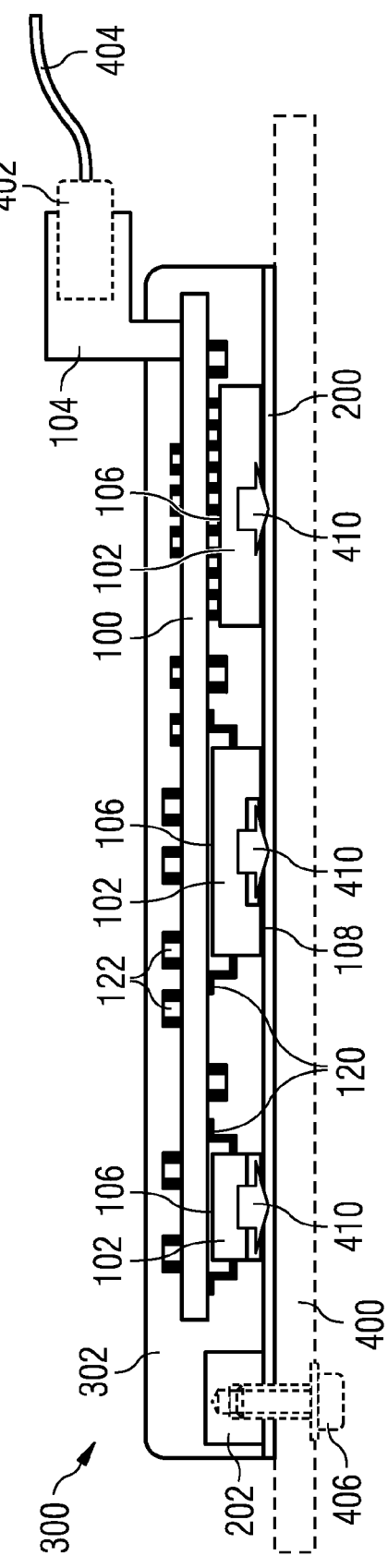

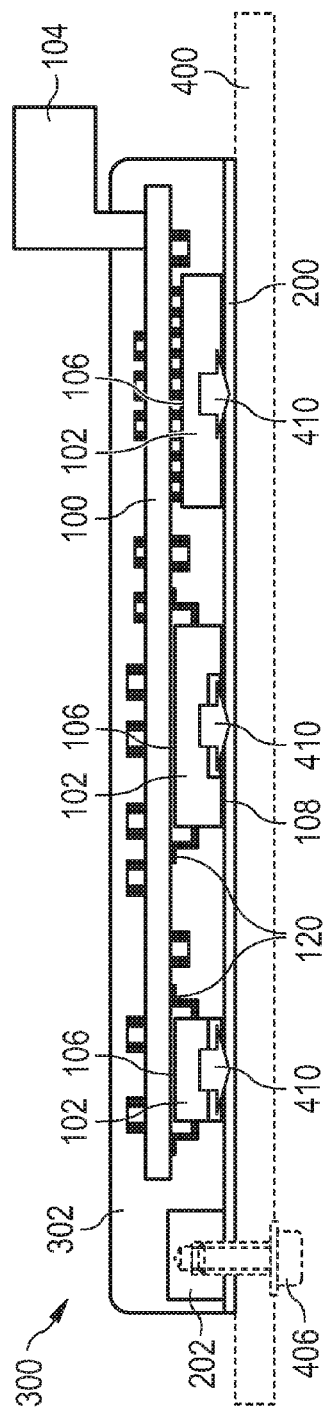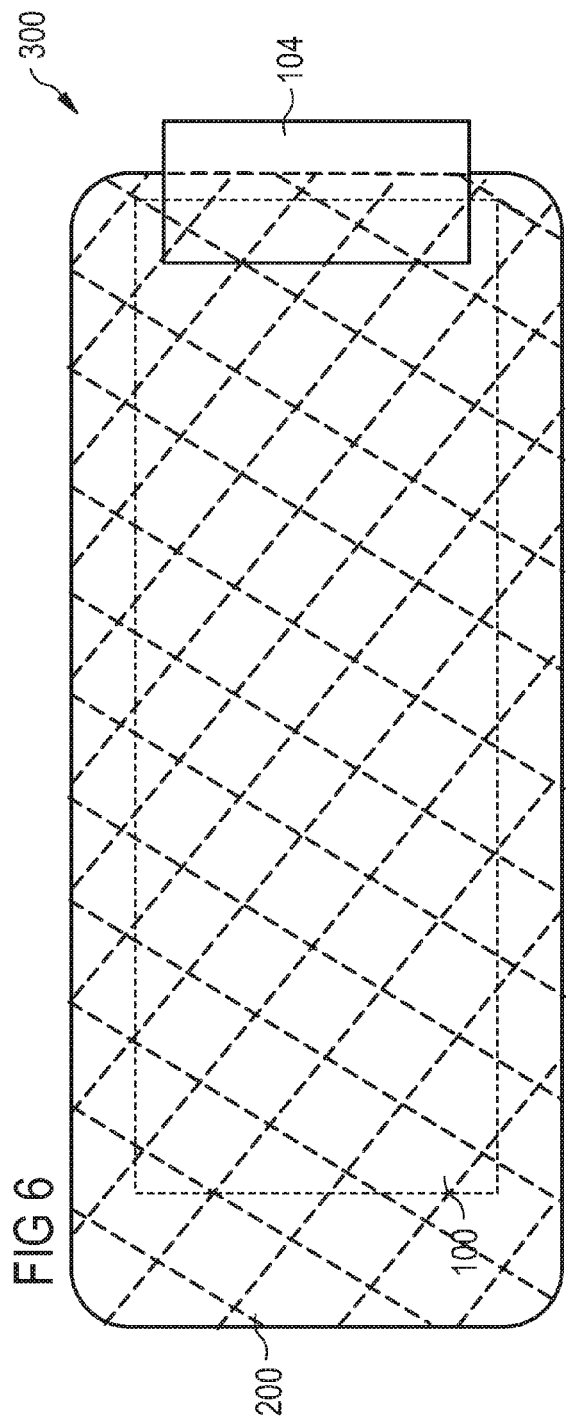

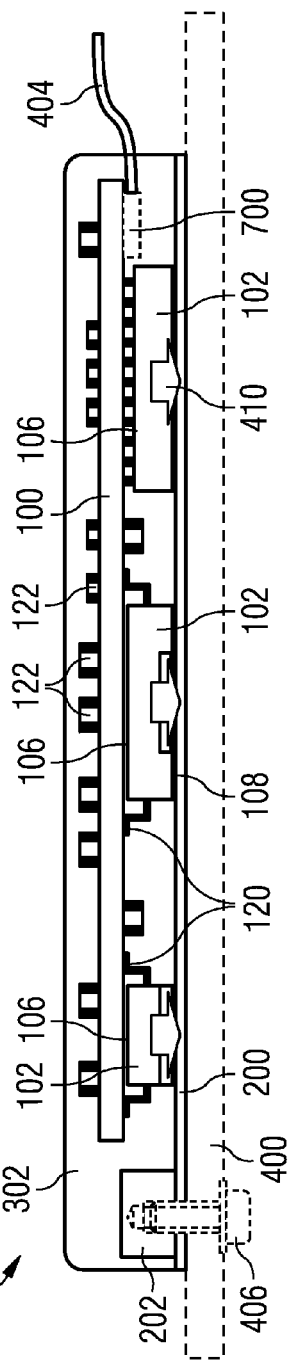
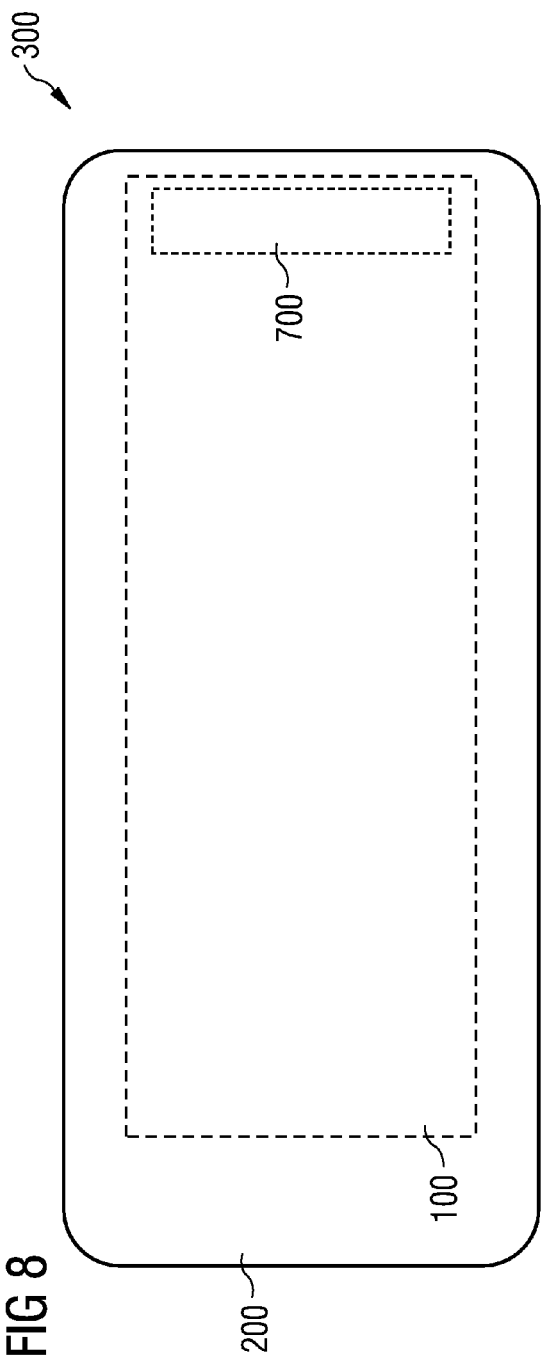

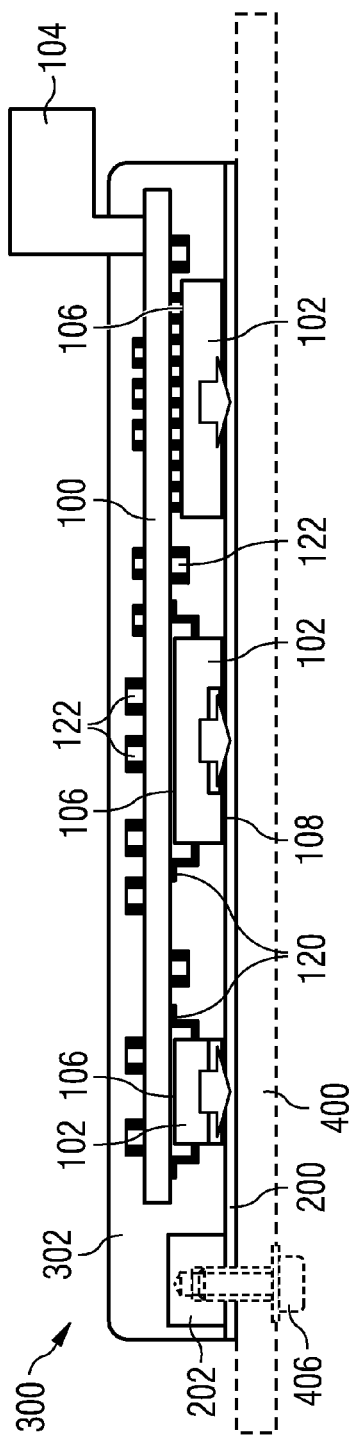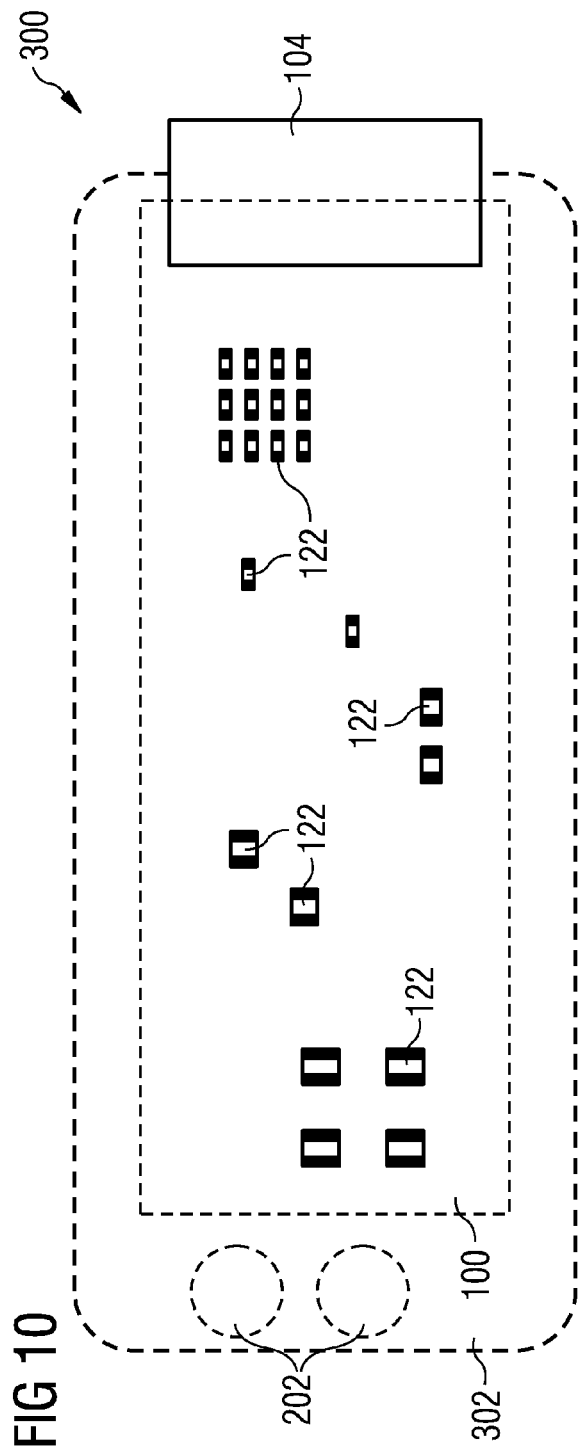

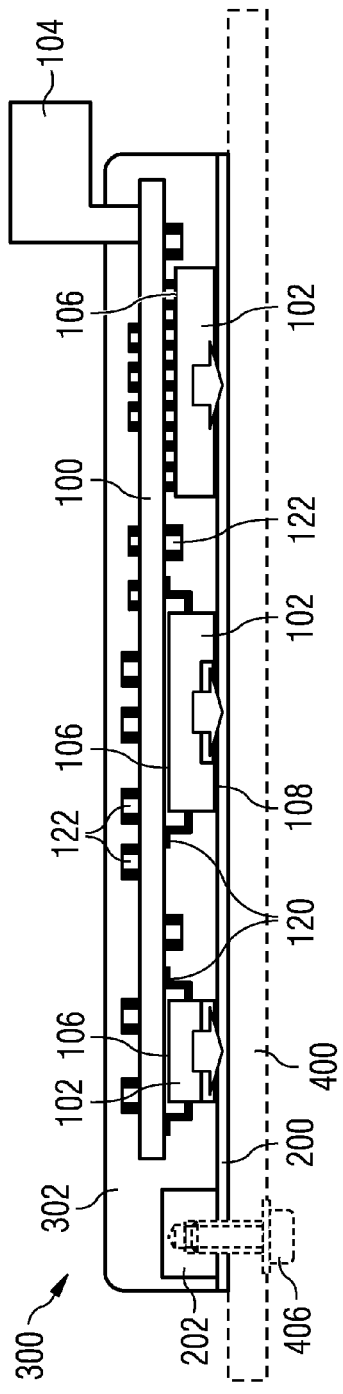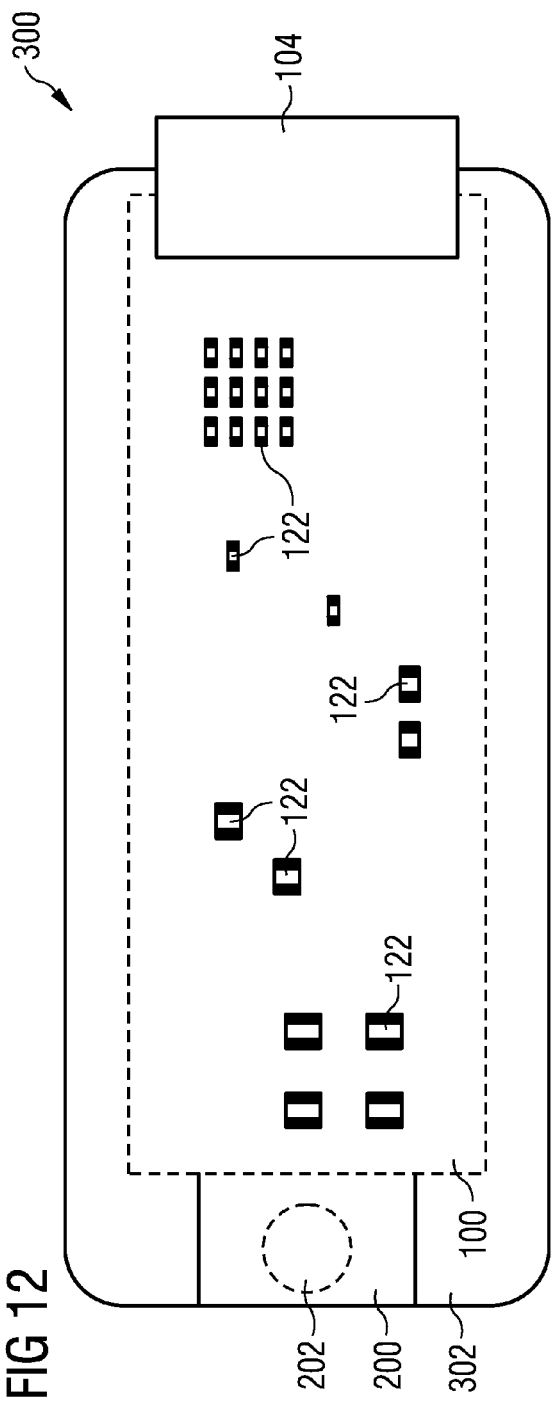

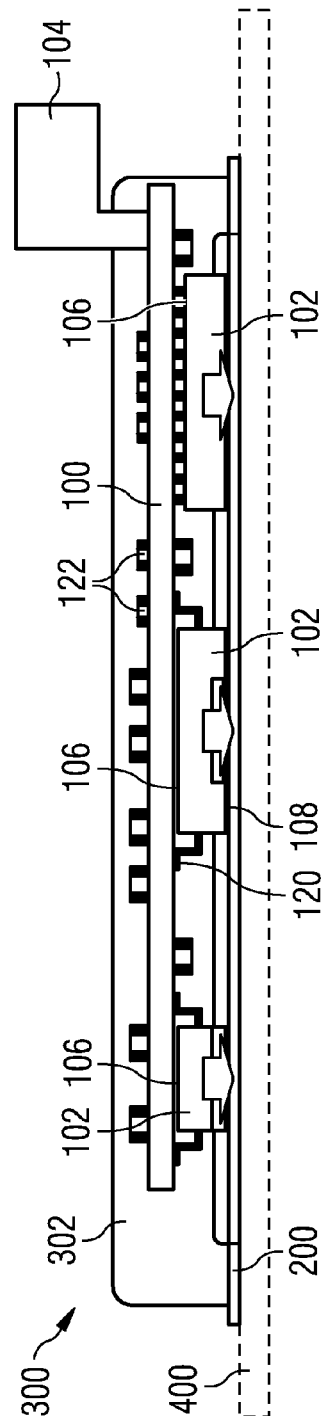
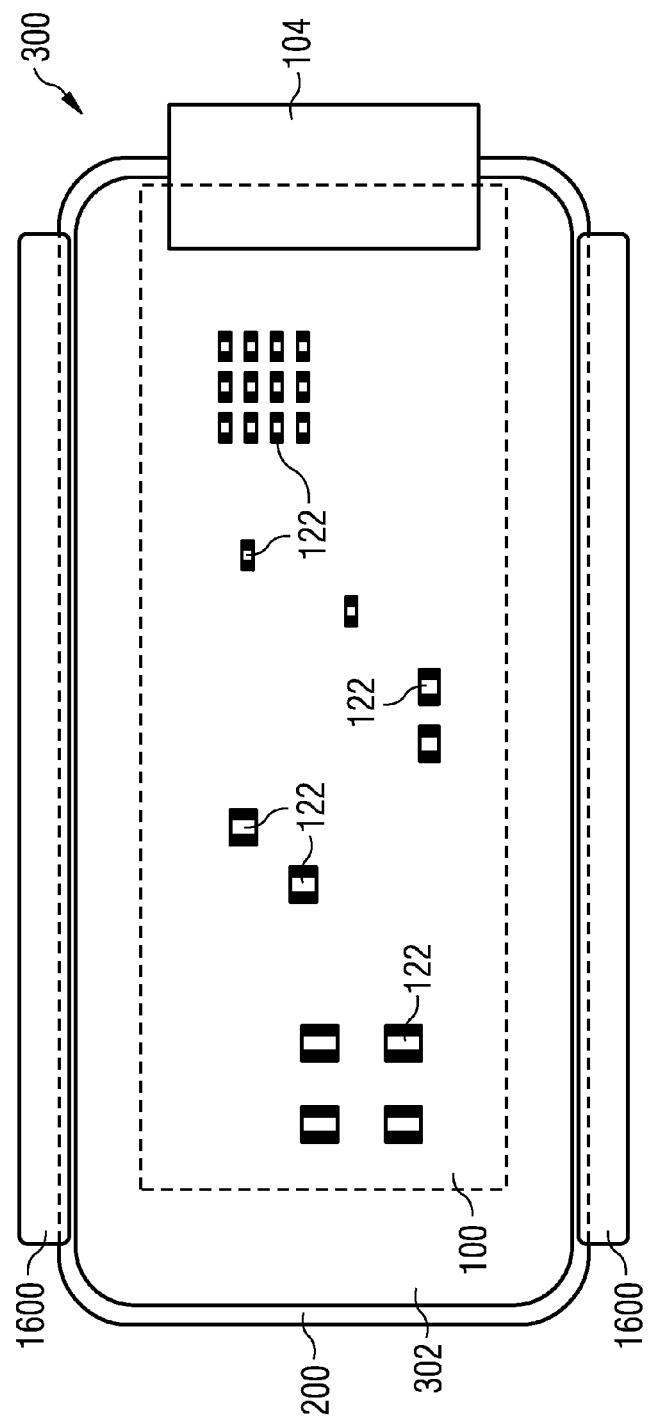

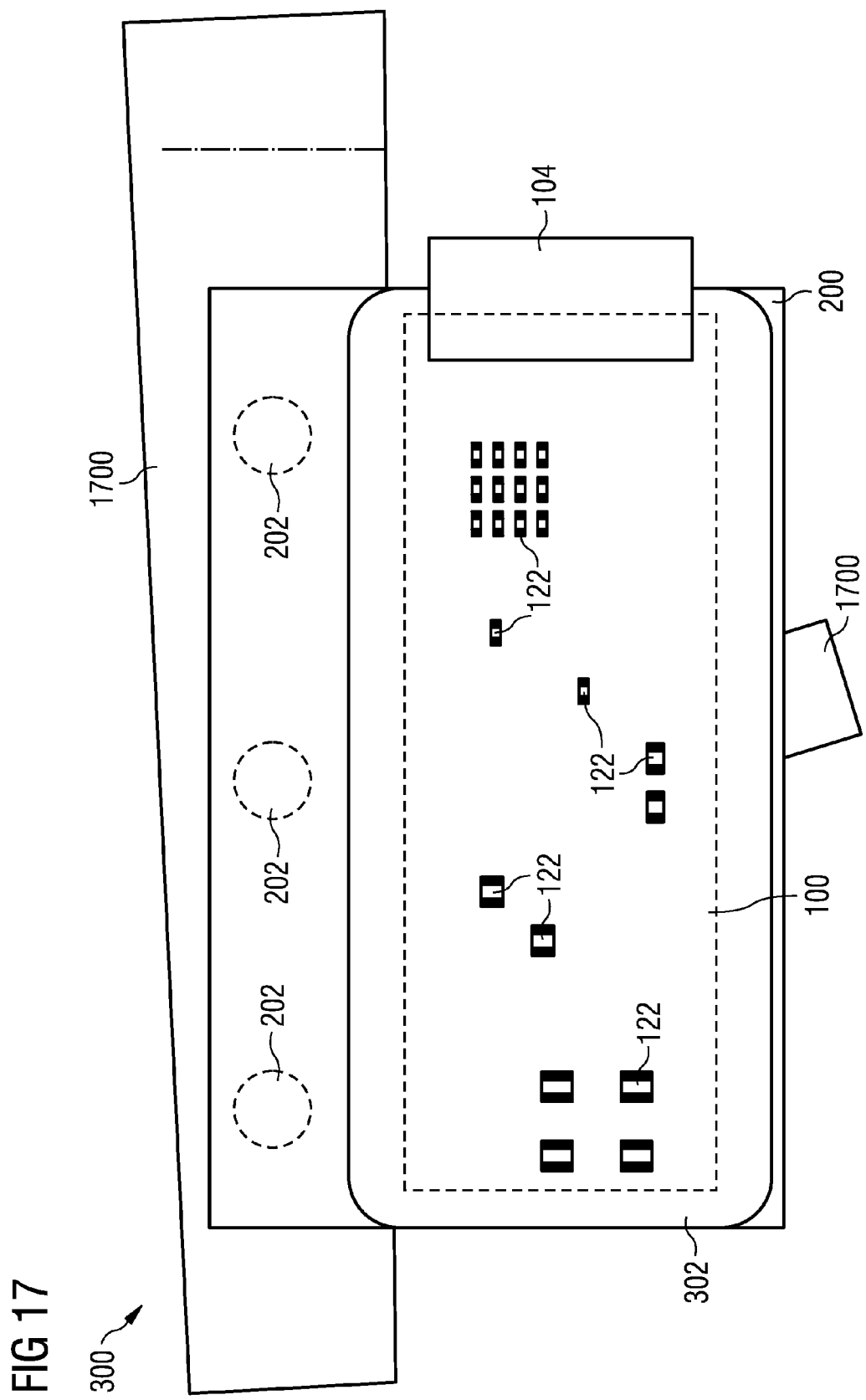

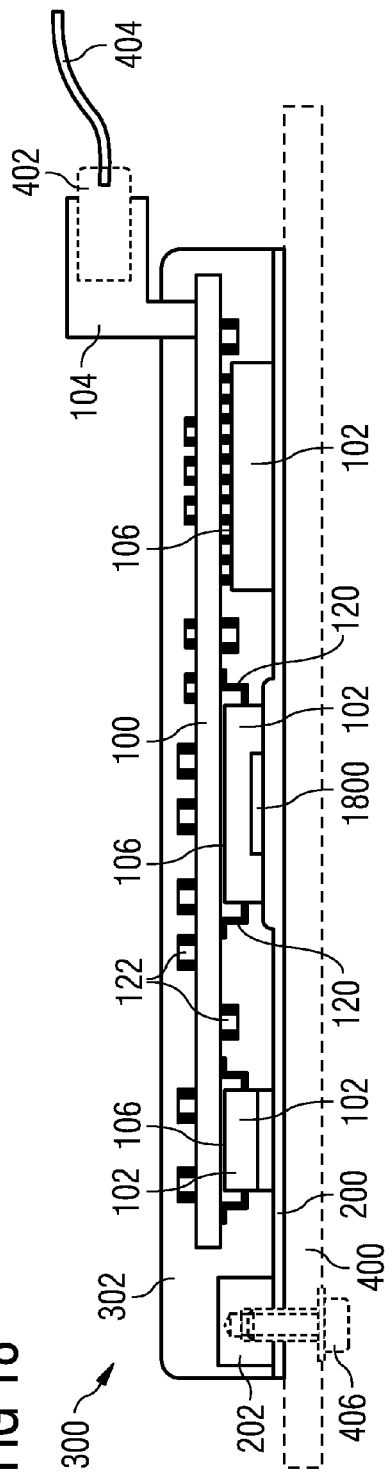
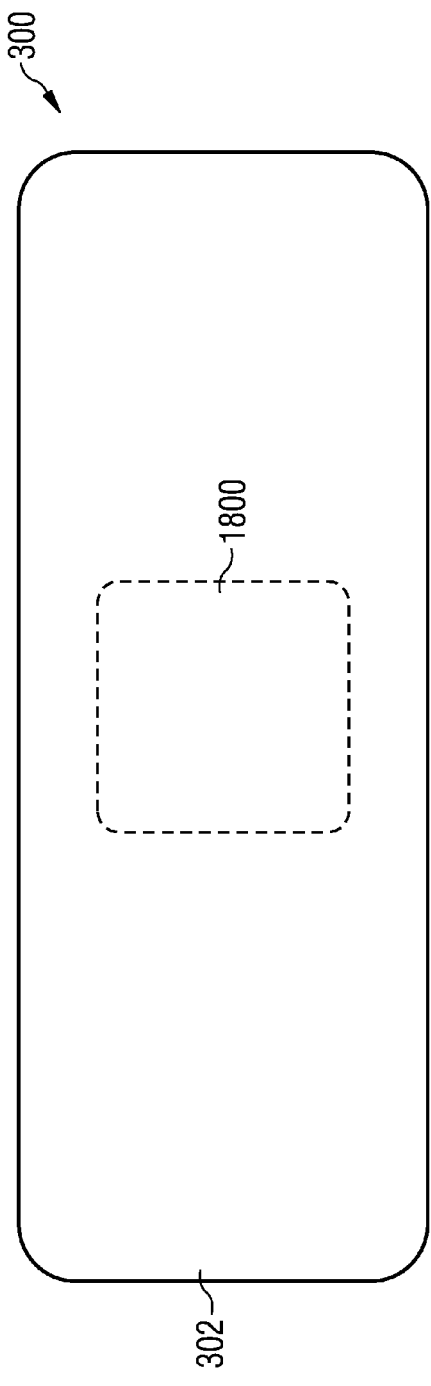

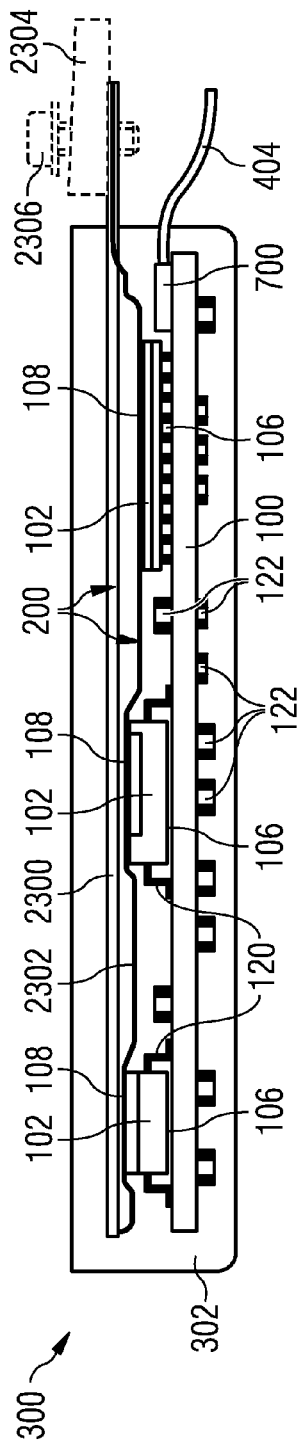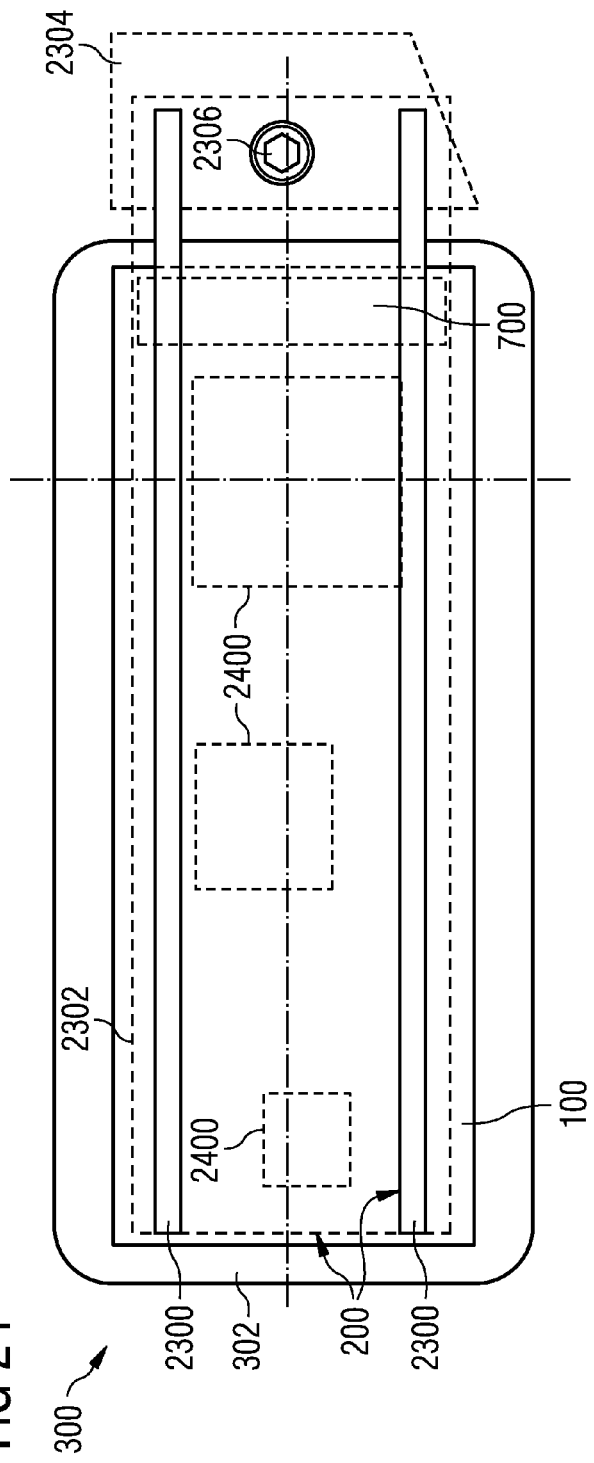

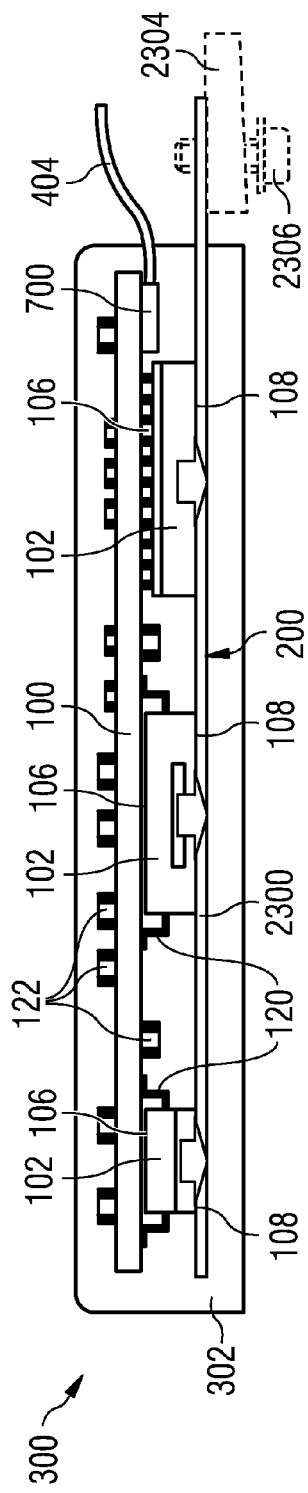
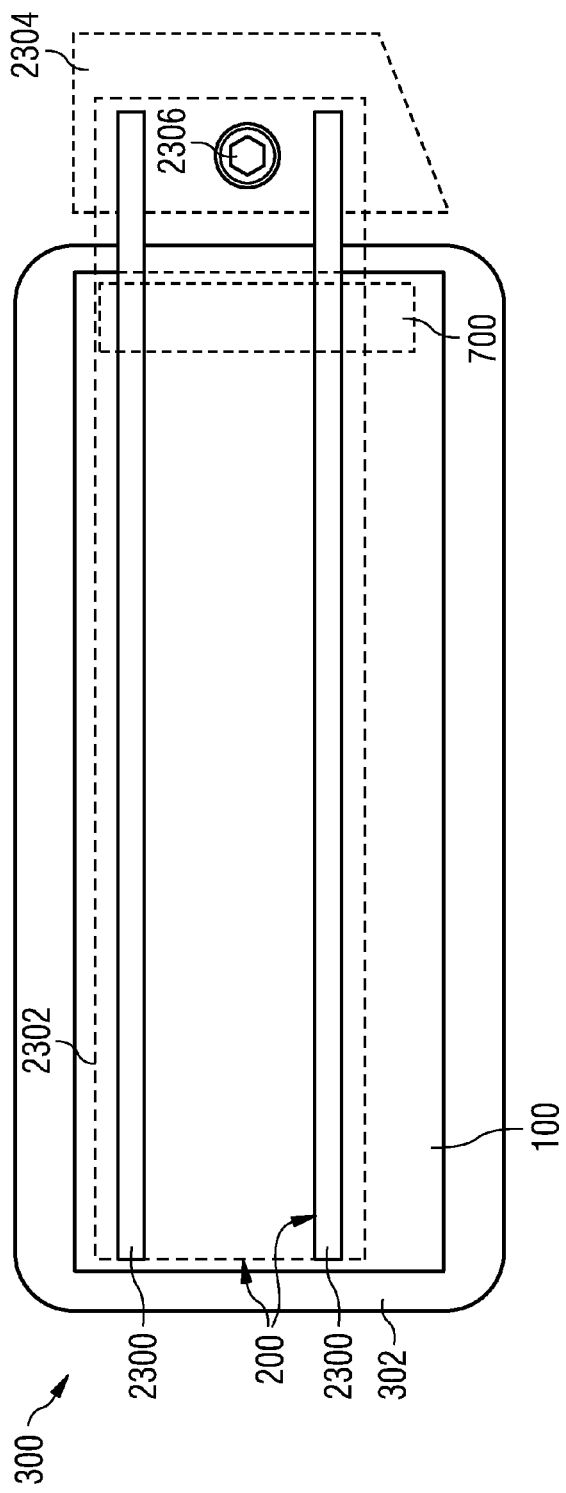

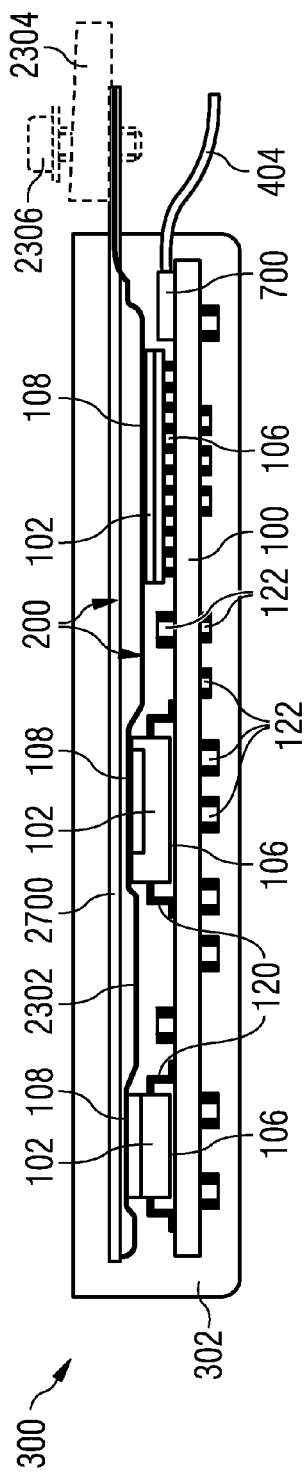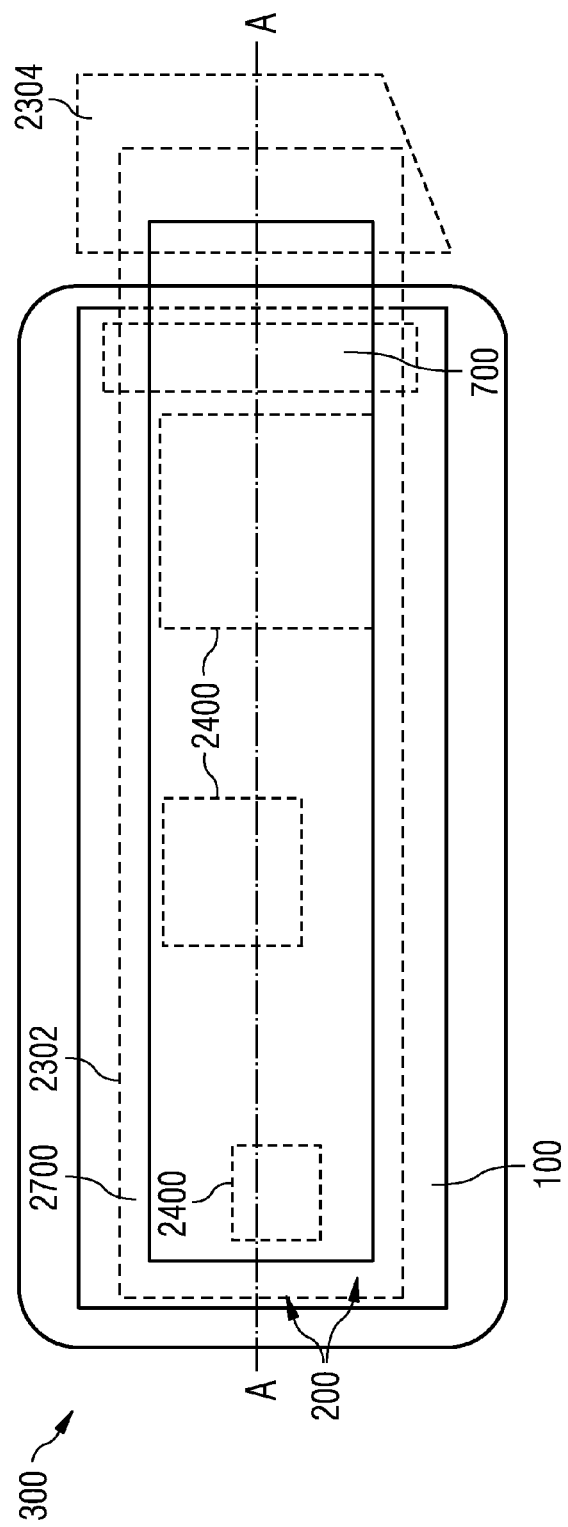

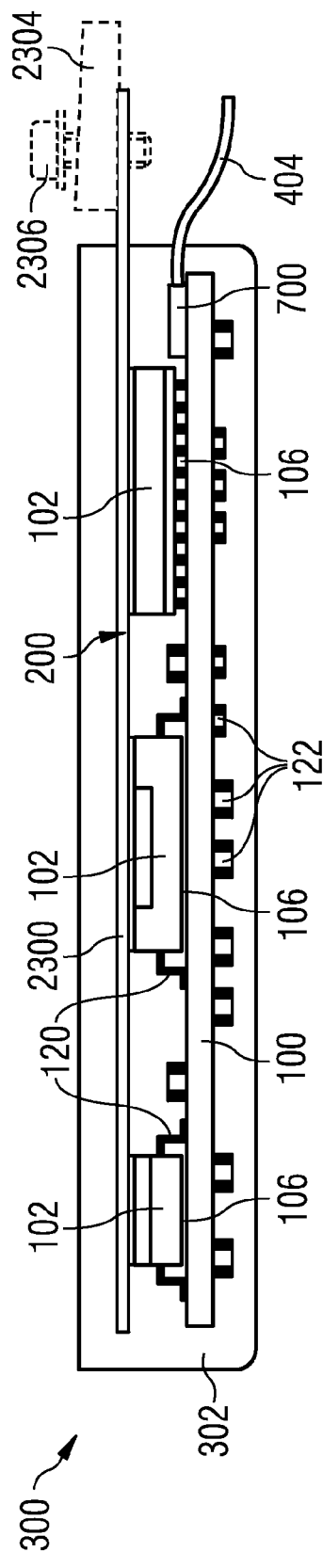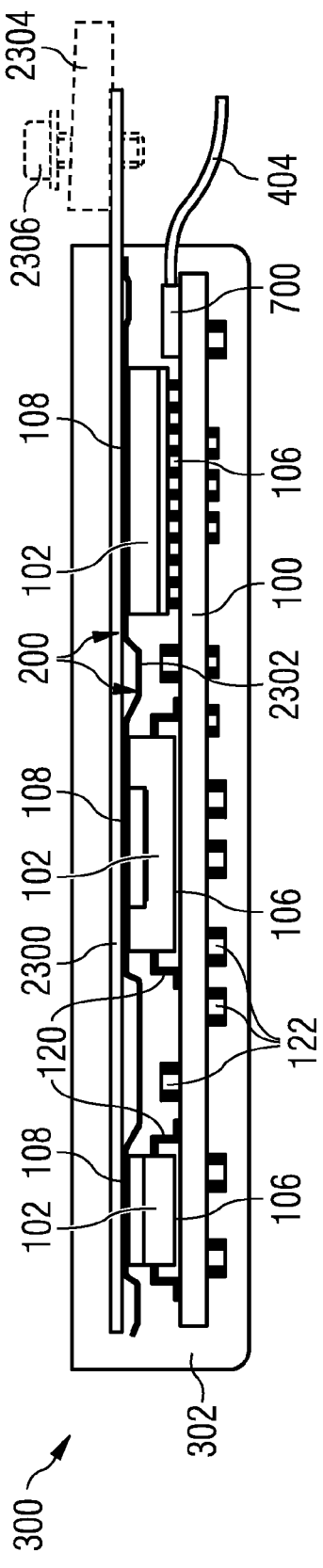

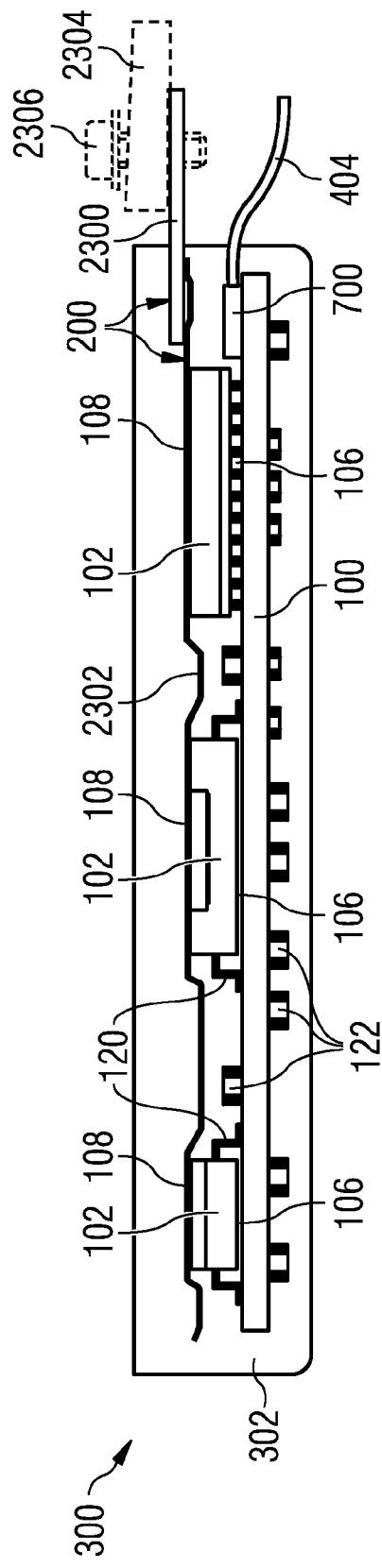

OVERMOLDED SUBSTRATE-CHIP ARRANGEMENT WITH HEAT SINK

BACKGROUND OF THE INVENTION

1. Field of the Invention

The present invention relates to an electronic device, an engine control module, and a method of manufacturing an electronic device.

2. Description of the Related Art

Upon operation, electronic circuits having semiconductor chips mounted on a substrate generate a significant amount of heat. Conventionally, the removal of heat of an electronic circuit with integrated semiconductors (such as microcontrollers) of a control device is performed via the substrate and a connected lid or housing. The cooling function in and the electric connection are both performed by the carrier material of the substrate. Compromises have to be made between the heat transport and the electronic properties. The mechanical protection in such conventional devices can be achieved via the exterior lid or housing. Alternatively, it is possible to mold the system in case of smaller applications.

Another conventional system comprises a printed circuit board (PCB) having thermal vias which are connected to a metal housing. However, this requires to use a separate metal housing which needs to be developed for each application individually.

SUMMARY OF THE INVENTION

There may be a need for an electronic device allowing for an efficient removal of heat generated during operation while being simple in manufacture.

According to an exemplary embodiment, an electronic device is provided which comprises a substrate, at least one electronic chip mounted on and electrically connected to the substrate and being configured as a system control unit for controlling a connected system, a heat removal structure thermally connected to the at least one electronic chip and configured for removing heat generated by the at least one electronic chip upon operation of the electronic device, and an overmolding structure configured for at least partially encapsulating at least the at least one electronic chip and the substrate.

According to another exemplary embodiment, a method of manufacturing an electronic device is provided, wherein the method comprises mounting and electrically connecting at least one electronic chip on a substrate, wherein the at least one electronic chip is configured as a system control unit for controlling a system connected or to be connected to the electronic device, thermally connecting a heat removal structure to the at least one electronic chip and configuring the heat removal structure for removing heat generated by the at least one electronic chip upon operation of the electronic device, and at least partially encapsulating at least the at least one electronic chip and the substrate by an overmolding structure.

According to yet another exemplary embodiment, an engine control module is provided which comprises at least one semiconductor chip with a first main surface and a second main surface opposing the first main surface, wherein the at least one semiconductor chip is configured for performing an engine control function, a printed circuit board to which the first surface of the at least one semiconductor chip is mounted and electrically connected, a heat removal structure to which the second surface of the at least one semiconductor chip is mounted and thermally connected to the second surface of the at least one semiconductor chip, wherein the heat removal structure is configured for removing heat generated by the at least one semiconductor chip upon operation of the engine control module, and an overmolding structure configured for at least partially encapsulating at least the at least one semiconductor chip and the printed circuit board.

A gist of an exemplary embodiment is that the one or more electronic chips of a system control unit for performing a control function with regard to an electrically connected system is mechanically and electrically supported on a substrate while simultaneously being connected at least thermally to a heat removing structure. Such an arrangement is overmolded so that at least part of an exterior surface of the electronic chip or chips and at least part of an exterior surface of the substrate are encapsulated by the molding material. Thus, the molding material may mechanically fix the various components to one another and may render a separate housing dispensable, while the electronic coupling is performed by the substrate and the thermal coupling is performed by the heat removal structure in combination with the overmolding structure. Thus, a compact, mechanically robust, electrically safely connected and strongly heat dissipating electronic device is provided which is highly appropriate for use as a system control unit with a high degree of integration.

DESCRIPTION OF FURTHER EXEMPLARY EMBODIMENTS

In the context of the present application, the term "substrate" may particularly denote any physical base structure which is configured for serving as a mounting base for electronic chips. For instance, the substrate may be a printed circuit board (PCB), a ceramic plate, a flex board, or any other support structure which is appropriate for receiving electronic chips to electrically contact and mechanically fasten the electronic chip or chips to the substrate.

The term "electronic chip" may particularly denote any electronic member which has active and/or passive circuit components, particularly integrated circuit components. Particularly, such an electronic chip may be a semiconductor chip.

The term "system control unit for controlling a connected system" may particularly denote that the electronic chip or the electronic chips as a whole is/are capable of controlling a technical system which can be electrically and mechanically connected via a connector of the electronic device to the electronic device. Such a control may include a processing of data by the electronic chip or chips in order to generate control commands to be transmitted from the electronic device to the connected system to thereby control operation of the latter. In one embodiment, the system control unit is configured as an engine control unit for controlling operation of a connected engine, such as a combustion engine or an electric engine. Therefore, the electronic device is capable for being used in the field of automated applications where one or more engines are implemented. For instance, the system control unit may be used for an automotive application such as the control of the drive engine or motor of a vehicle, a window lift motor of a vehicle, a drive engine of a centralized door locking system in a door of a vehicle, etc. In another embodiment, the electronic device with its system control unit may be capable of controlling an engine-driven machine tool such as a drilling machine, a bolt-firing tool, etc. In still another exemplary embodiment, the system control unit may also be capable of controlling an engine-free system, such as a vehicle lightning system or the like.

The term "overmolding structure" may particularly denote that a mold which can be supplied in a liquid or granulate form is deposited over the substrate—electronic chip—heat removal structure arrangement and is subsequently hardened or cured so that at least a part of the substrate surface and at least a part of the electronic chip surface is covered by the mold material. The overmolding structure may then form at least part of an exterior surface of the resulting arrangement. The mold material may be a plastic material, having, if desired or required, filler particles embedded therein for adjusting the material properties thereof (for instance for increasing the thermal conductivity). Such an overmolding not only mechanically fastens the various components to one another but also provides for a robust constitution of the electronic device and can contribute also to the heat removal capability of the overmolding structure.

A gist of an exemplary embodiment is that a very good thermal coupling of the one or more electronic chips with regard to the environment during system operation may be achieved which in turn results in a proper heat dissipation. For instance, the electronic chips may be electrically coupled to the substrate on one main side of the electronic chips. At the other main side the electronic chips may be thermally connected to a heat removal structure such as a cooling plate (or any other appropriate cooling structure). Thus, the electric path between an electronic chips and substrate may be located opposing the thermal path between electronic chips and heat removal structure. The entire system of substrate, electronic chips and cooling plate may be overmolded so as to mechanically fix them to one another and to further promote heat dissipation via thermally conductive mold material. The heat removal structure may, particularly in form of a cooling plate, serve for accommodating a carrier or holder for installation. A plug connector may be connected to the substrate (such as an electronic circuit board). An electrical connection of the heat removal structure to the electric system (for instance a ground connection and/or for an electric shielding) is possible.

With such an embodiment it is possible to separate the electric path from the thermal path when designing system control units with an overmolded module. This allows a user (such as a system integrator) a very efficient thermal handling while keeping the manufacturing costs low. In view of the encapsulation by the overmolding, a separate housing of the electronic device is dispensable.

In exemplary embodiments, overheating of power components (for instance MOSFETs) may be prevented by implementing an overmolded printed circuit board. The cooling performance of the power components may be improved by the provision of a heat sink. In an embodiment, the protection against environmental influences, which is conventionally achieved by a cost-intensive specifically adapted and application dependent metal housing, can be achieved by overmolding. Different electronic control unit/printed circuit board designs can be housed with only small application specific modifications by a simple, common overmolding procedure. In order to strengthen a thermal cooling of the power members in form of the electronic chips, an exemplary embodiment applies overmolding in such a way that one or more additional heat sink structures may be molded on or within the electronic device or are mounted onto the electronic device after overmolding. One option is an overmolded printed circuit board with a heat sink integrated by the overmolding. Another option is an overmolded printed circuit board with a later (i.e. after the overmolding) mounted heat sink, wherein the mounting may be accomplished for instance by screwing, clamping, riveting, adhering, etc. Still another option is an overmolded printed circuit board, wherein upper main surfaces of the electronic chips extend to be exposed to an environment and are directly or indirectly connected to a heat removal structure mounted after the overmolding.

In the following, further exemplary embodiments of the electronic device, the engine control module and the method will be explained.

In an embodiment, the substrate has a first main surface and a second main surface opposing the first main surface, wherein the at least one electronic chip is mounted on the first surface and the heat removal structure is mounted on the second surface (see for instance FIG. 20). In such an embodiment, the heat removal structure and the at least one electronic chip are mounted on opposing main surfaces of the substrate. The main surfaces may be the surfaces of the for instance plate-like substrate which are specifically configured for mounting electronic members thereon. The main surfaces may have a significantly larger surface area than the remaining surfaces of the substrate. In order to realize a proper thermal coupling between the heat removal structure and the one or more electronic chips, thermally conductive structures may be provided extending along the substrate from the first main surface to the second main surface and/or may extend through the substrate, for instance in the form of one or more vias of a thermally conductive material.

In another embodiment, the at least one electronic chip has a first main surface and a second main surface opposing the first main surface, wherein the at least one electronic chip is mounted with its first surface (directly, i.e. with direct physical contact, or indirectly, i.e. with at least one member in between) on the substrate and is mounted with its second surface (directly, i.e. with direct physical contact, or indirectly, i.e. with at least one member in between) on the heat removal structure (see for instance FIG. 3). In such an embodiment, the one or more electronic chips serve as mounting base for the heat removal structure on one side and may be electrically and mechanically connected to the substrate on the other side. By such a configuration, the thermal path from the electronic chip or chips towards the heat removal structure may be separated clearly from the electrical path from the electronic chip or chips to the substrate. By sandwiching the electronic chip or chips between a heat removal plate and a plate-like substrate, both substrate and heat removal plate also provide for a mechanical protection of the electronic chip or chips and may enclose a hollow space which can be filled with the overmolding structure to further strengthen the mechanical robustness.

In an embodiment, the at least one electronic chip has a first main surface and a second main surface opposing the first main surface, wherein the at least one electronic chip is mounted with its first surface on the substrate, and the heat removal structure is mounted with a varying height on the second main surface of the at least one electronic chip. For this purpose, an at least partially flexible (particularly elastically deformable) or ductile (particularly plastically deformable) heat removal structure may be implemented in the device. For instance, a fully overmolded connection may be formed, for instance solder to cable, or with for instance a wedge connector.

In an embodiment, the device comprises an electric connector which is electrically coupled with the substrate (which may even be integrally formed with the substrate), being only partially covered by the overmolding structure and extending beyond the overmolding structure so as to be exposed towards an environment, and being configured for electrically connecting the device to a connection apparatus (which may be the connected system, or which may at least form part of the connected system, or which may be arranged between the electronic device and the connected system). The electric connector may serve for providing an electric connection from the electronic device towards the connected system to be controlled by the system control unit. The connector may be integrally formed with the substrate or may be a separate component mounted to the substrate. By partially covering the connector with overmolding material, particularly the connection to the substrate may be mechanically strengthened. Additionally, the overmolding may simultaneously form an electric insolation of an electrically conductive connection between the electric connector and the substrate. Thus, the overmolding may synergetically function as an electric safety feature for a user.

In an embodiment, the electric connector comprises at least one of the group consisting of a cable, and a plug connector. When the electric connector is configured as a plug connector, its plug can be plugged into a counterpiece of the connection apparatus (such as the connected or connectable system to be controlled by the system control unit), for instance a cable tree of a vehicle. One or usually more electric connection elements, each transporting a separate electric signal, may be provided at the plug connector. In an alternative embodiment, the electric connector is configured as a cable (which may have an electrically conductive core and a surrounding electric insulation) so that a plug connector can be omitted and the substrate can be electrically coupled directly via the simple cable to the connected system. Thus, a lightweight, failure-robust and compact system may be provided in which costs for the plug connector can be avoided.

In an embodiment, the device comprises an electric connector electrically coupled with the substrate and being fully covered by the overmolding structure, wherein the device comprises one or more wired interconnects extending from the electric connector beyond the overmolding structure and being configured for electrically connecting the device to a connection apparatus. Thus, the entire electric connector may be protected by the molding structure. Electric signals may be transported out of the overmolded volume by simple wire connections.

In an embodiment, the overmolding structure and the heat removal structure are configured for completely encapsulating at least the at least one electronic chip and the substrate so that both the at least one electronic chip and the substrate are circumferentially surrounded completely by the overmolding structure and the heat removal structure. For instance, part of the surface of the electronic chip and/or the substrate may be in direct contact with the heat removal structure, and a remaining surface of the electronic chip and/or the substrate may be fully covered by the mold material. In other words, the overmolding structure together with the heat removal structure may be configured for fully encapsulating the at least one electronic chip and the substrate. Then, no surfaces of electronic chips and substrates remain exposed to an exterior environment. Such an embodiment is advantageous, since no free surfaces of the at least one electronic chip and of the substrate remain outside of the overmold structure. Thus, a mechanical and electrical protection of the electronic chips as well as of the substrate may be achieved.

In an embodiment, the device comprises an electrical coupling structure (such as a wiring connection or an electric connection by vias extending through the substrate) configured for electrically coupling the substrate with the heat removal structure. Therefore, the heat removal structure, which advantageously can be made of an electrically conductive metal (such as copper or aluminum) can serve simultaneously to provide an electrical function, for instance to provide a mass connection or ground connection. Additionally or alternatively, the heat removal structure may also contribute to the shielding of external electromagnetic radiation from the electronic chips. The functionality of the electronic chips may be deteriorated in the presence of electromagnetic stray radiation.

In an embodiment, an external surface of the heat removal structure remains uncovered from the overmolding structure. By keeping the heat removal structure at least partially uncovered and directly exposed with regard to an environment, the heat conducted from the electronic chips towards the heat removal structure may be transported efficiently away from the electronic device by supplying it to a cooling medium present in the environment. Such a cooling medium may be a cooling fluid such as a gas (for instance air) or a liquid (for instance water).

In an embodiment, the overmolding structure and the heat removal structure form at least part of an exterior surface of the device. In such an embodiment, a separate external casing is dispensable which renders the electronic device compact, light in weight and cheap in manufacture. In contrast to this, an outer surface of the overmolding structure in combination with an outer surface of the heat removal structure may functionally substitute such a casing. Thus, an electronic device according to an exemplary embodiment may be free of an external housing.

In an embodiment, the heat removal structure comprises or consists of a metal. Metallic materials such as copper or aluminum show a proper behavior in terms of thermal conductivity and are therefore particularly appropriate as material for the heat removal structure. At the same time, such metallic materials may contribute to the electronic function of the electronic device and may additionally function to shield electromagnetic radiation from the environment.

In an embodiment, the heat removal structure is configured as a thermally conductive plate. Such a thermally conductive plate may serve as mounting platform for mounting electronic chips thereon and can also serve as a base or support onto which the overmolding material can be applied in liquid or viscous form, i.e. prior to hardening or curing.

In an embodiment, the overmolding structure is made of a plastic material. Any mold material appropriate for encapsulating electronic members by molding can be used for the overmolding structure. Filler material for improving certain physical properties of the overmolding material, such as electrically conductive and/or thermally conductive filler particles, may be embedded in the plastic material.

In an embodiment, the substrate is a printed circuit board (PCB). A PCB can be used to mechanically support and electrically connect the electronic chips using conductive pathways, tracks or signal traces etched from metal (particularly copper) layers laminated onto a non-conductive sheet. As an alternative to a PCB, it is also possible to use a flex board, a ceramic board or any other base structure configured for mounting electronic chips thereon and for accomplishing an electrical coupling between them.

In an embodiment, the device comprises a microcontroller mounted and electrically connected on the substrate and encapsulated by the overmolding structure. Such a microcontroller can be a small computer on a single integrated circuit containing a processor core, memory, and programmable input/output peripherals. The microcontroller may contribute to the system control function of the electronic chip or chips.

In an embodiment, the system control unit is configured for automotive applications, in particular for engine control of an automotive system. Such automotive applications may relate to engine-driven two-wheeled vehicles or four-wheeled vehicles. Such automotive applications may specifically relate to various parts of a vehicle, such as combustion engine and/or electric motor control, control of a window lift motor, control of a vehicle lightning system, etc. In such systems, a system control unit has to perform extensive processing tasks and may have to handle high current values. Thus, heat dissipation is of upmost importance in such systems. The electronic device configured for automotive system control may be plugged to a cable tree of the vehicle.

In an embodiment, the thermal connecting is performed before the encapsulating. In this procedural order, the encapsulating may also accomplish a mechanically fastening of the heat removal structure to the electronic chips and/or to the substrate. In such an embodiment, the method may hence comprise connecting the heat removal structure to the substrate by the encapsulating.

In an alternative embodiment, the thermally connecting is performed after the encapsulating. In such a procedural order, the thermal connection may be done after hardening the encapsulation material. In such an embodiment, the method may comprise connecting the heat removal structure to the substrate by at least one additional mechanical connection procedure, in particular by screwing, clamping, riveting and/or adhering. Thus, one or more screws, one or more clamps, one or more rivets and/or adhesive material may be used for performing the fastening.

In an embodiment, the method comprises mounting the heat removal structure on the substrate and forming a thermal connection structure thermally connecting the heat removal structure with the at least one electronic chip through the substrate. In such a scenario, the at least one electronic chip may be arranged on an opposing main surface of the substrate as compared to another main surface of the substrate at which the heat removal structure is mounted. In such an embodiment, heat removal structure and electronic chip or chips may be mounted on opposing sides of the substrate.

Still referring to the previously described embodiment, the method may further comprise forming the thermal connection structure by at least one via extending through the substrate to thereby thermally connect the at least one electronic chip mounted on a first main surface of the substrate with the heat removal structure mounted on a second main surface of the substrate opposing the first main surface. One or more vias extending through the substrate and filled with a thermally conductive material may hence be used as the thermal connection structure. Such vias may be filled with thermally conductive material, such as copper or aluminum.

In an embodiment, the heat removal structure has a mechanical fastening provision configured for mechanically fastening the device to a mounting base of the connected system. Such a mechanical fastening provision may comprise one or more screws, rivets, bolts, clamps, etc.

In an embodiment, the system control unit is formed by a plurality of electronic chips having different height and being mounted on and electrically connected to the substrate, wherein at least one of the heat removal structure and the substrate has a mounting surface facing the plurality of electronic chips and having a height profile at least partially compensating for the different height of the plurality of electronic chips. For instance, the substrate may be a planar plate on which the electronic chips with their different heights are mounted. In order to promote a proper heat dissipation by a large contact surface between the electronic chips and the heat removal structure while maintaining a simple external shape of the device, the chip contact surface of the heat removal structure may be equipped with height equilibration elements which serve as thermal and structural interconnects between the electronic chips and the heat removal structure. Additionally or alternatively, such heat bridging spacers may also be arranged on the substrate for compensating for different height values of the electronic chips.

In an embodiment, the heat removal structure is configured as a thermally conductive grid (for instance a metal grid) having recesses (such as through holes, for instance arranged in a matrix-like pattern) being at least partially filled with material of the overmolding structure. When the material of the overmolding structure is still liquid or viscous during manufacture of the electronic device, such mold material will also flow or may even be pressed into the recesses of the grid-like heat removal structure and may be hardened there. This promotes the mechanical connection between the heat removal structure and the overmolding structure and also improves the thermal coupling between the various components of the device.

In an embodiment, the heat removal structure is at least partially made of an elastically deformable or a plastically deformable material so that a height profile of the heat removal structure is adaptable during assembly of the device to compensate for level deviations. The heat removal structure may be ductile or flexible to compensate for different height levels caused by manufacturing tolerances and/or height dimensions of different electronic chips and/or other effects. The heat removal structure may comprise a flexible or ductile material which is elastically or plastically deformed during manufacturing the electronic device for compensating for height differences (compare FIG. 23 to FIG. 31).

In an embodiment, the heat removal structure comprises a rigid member and comprises an elastically or plastically deformable member connected to the rigid member. The rigid member (such as an array of beams or a polygonal frame) may provide mechanical stability and may support the deformable member. The deformable member (such as a bendable plate or a grid or a web of filaments) may allow for a geometrical adaptation (for instance height equilibration) of the heat removal provision to different components of the electronic device. Both the rigid member and the deformable member may be made of a thermally conductive material such as copper.

The overmold compound (or encapsulation structure) packages, houses or accommodates the above-mentioned components of the electronic device, particularly the substrate, the heat removal structure and the electronic chip(s). It may house further components as well, such as a thermal interconnect structure, additional active or passive electronic components (such as capacitors, resistors, etc.). The mold compound may be made of one or several materials and may for instance be made of a plastic material or a ceramic material.

In an embodiment, the at least one electronic chip may be at least one semiconductor chip which comprises at least one integrated circuit component of a group consisting of a processor, a power chip, a switch (such as a metal-oxide-semiconductor field effect transistor (MOSFET), an insulated-gate bipolar transistor (IGBT), etc.), a diode, a half bridge (i.e. an inverter leg, with two switches and corresponding diodes), and an inverter (for instance six switches and corresponding diodes). Multiple of such and other electronic members may be integrated in the same semiconductor chip, or multiple semiconductor chips comprising these and/or other integrated circuit components may form part of the electronic device.

As substrate or wafer for the electronic chips when configured as semiconductor chips, a semiconductor substrate, preferably a silicon substrate, may be used. Alternatively, a silicon oxide or another insulator substrate may be provided. It is also possible to implement a germanium substrate or a III-V- semiconductor material. For instance, exemplary embodiments may be implemented in GaN or SiC technology. For the packaging, molding or encapsulation, a plastic material or a ceramic material may be used. Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 1 to FIG. 3 show cross-sectional views of different arrangements obtained during a method of manufacturing an electronic device according to an exemplary embodiment of the invention, wherein the manufactured electronic device is shown in FIG. 3.

FIG. 4 shows a cross-sectional view of the electronic device of FIG. 3 mounted on an application specific base by screwing and electrically connected to a connected system.

FIG. 5 illustrates a cross-sectional view and FIG. 6 illustrates a plan view of an electronic device according to another exemplary embodiment which differs from the embodiment of FIG. 4 by the configuration of a connector element.

FIG. 7 shows a cross-sectional view and FIG. 8 shows a plan view of an electronic device according to another exemplary embodiment which differs from the embodiment of FIG. 5 and FIG. 6 by the configuration of the connector element.

FIG. 9 shows a cross-sectional view and FIG. 10 shows a plan view of an electronic device according to another exemplary embodiment which differs from the embodiment of FIG. 5 and FIG. 6 concerning provisions for mounting the electronic device on an appliance.

FIG. 11 shows a cross-sectional view and FIG. 12 shows a plan view of an electronic device according to another exemplary embodiment which differs from the embodiment of FIG. 9 and FIG. 10 concerning provisions for mounting the electronic device on an appliance

FIG. 15 shows a cross-sectional view and FIG. 16 shows a plan view of an electronic device according to another exemplary embodiment which differs from FIG. 5 and FIG. 6 with regard to its mounting on an appliance.

FIG. 17 shows a plan view of an electronic device according to an exemplary embodiment having provisions for mounting on an appliance.

FIG. 18 shows a cross-sectional view and FIG. 19 shows a plan view of an electronic device according to an exemplary embodiment which differs from FIG. 4 by an additional chip height equilibration profile of the heat removal structure.

FIG. 23 illustrates a cross-sectional view and FIG. 24 illustrates a plan view of an electronic device according to another exemplary embodiment which comprises a heat removal structure formed of a rigid heat removal pipe arrangement and an additional ductile heat spreader.

FIG. 25 illustrates a cross-sectional view and FIG. 26 illustrates a plan view of an electronic device according to another exemplary embodiment which is similar to the embodiment of FIG. 23 and FIG. 24 but has an additional elastically flexible heat spreader.

FIG. 27 illustrates a cross-sectional view and FIG. 28 illustrates a plan view of an electronic device according to another exemplary embodiment which comprises a heat removal structure formed of a heat removal frame and an additional ductile heat spreader.

FIG. 29 shows a cross-sectional view of an electronic device according to an exemplary embodiment in which a heat removal structure comprises a heat pipe.

FIG. 30 shows a cross-sectional view of an electronic device according to an exemplary embodiment in which a heat removal structure comprises a heat pipe and a deformable foil or mesh of electrically conductive material.

FIG. 31 shows a cross-sectional view of an electronic device according to an exemplary embodiment in which a heat removal structure comprises a short heat pipe and a deformable foil or mesh of electrically conductive material.

DETAILED DESCRIPTION OF EXEMPLARY EMBODIMENTS

Figure 1:
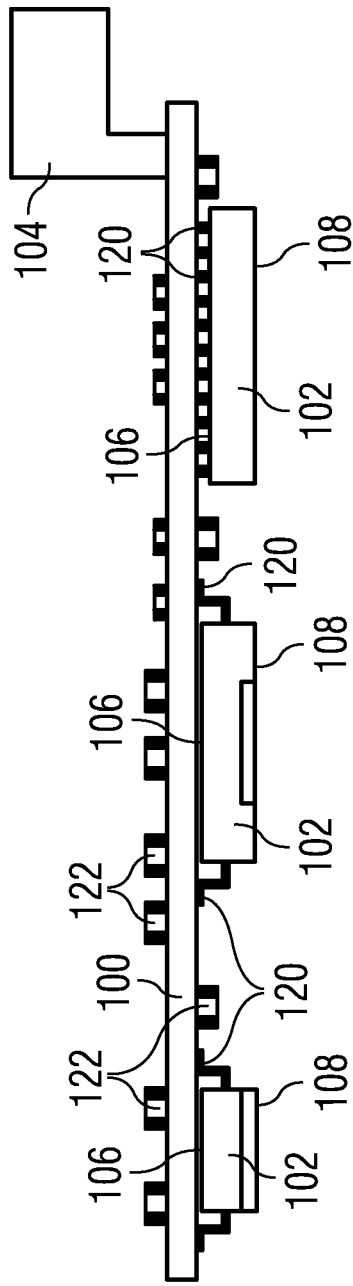

The illustration in the drawing is schematically and not to scale.

Before exemplary embodiments will be described in more detail referring to the figures, some general considerations will be summarized based on which exemplary embodiments have been developed.

An exemplary embodiment provides a highly advantageous combination of an electrical integration, a thermal integration, a mechanical integration and a system integration of components of an electronic device with a chip-based system control unit for controlling a connected system (such as an automotive system). With regard to the electrical integration, components (such as electronic chips) and connectors may be soldered bottom side to a substrate (such as a printed circuit board). With regard to the thermal integration, the heat generating package(s) may be connected (for instance by glue or solder) with the top side to the cooling plate. In order to accomplish the mechanical integration, the assembled system board (for instance printed circuit board plus components and cooling plate) can be overmolded. The system integration may be achieved by a mechanical assembly based on a fixture placed on the cooling plate. An electrical interconnect may be formed through a connector or connectors mounted on the substrate. A conventionally used housing may be replaced by overmolding the whole electronic control unit.

A gist of a corresponding exemplary embodiment is that electrical integration, mechanical integration and/or system integration may be done on different levels and not critical to related manufacturing tolerances. Particularly, a split of thermal and electrical interconnects of an electronic control unit may be performed.

In the following, referring to FIG. 1 to FIG. 3, a method of manufacturing an electronic device 300 according to an exemplary embodiment will be explained.

FIG. 1 shows a cross-sectional view of a substrate 100 embodied as a printed circuit board on which in this case three electronic chips 102 embodied as semiconductor chips are mounted. The electronic chips 102 are electrically connected to the substrate 100 via electric connection elements 120 such as wire bonds. As can be taken from FIG. 1, a first main surface 106 of the electronic chips 102 is mechanically connected to the substrate 100. Furthermore, a plurality of passive electric elements 122, such as capacitances, ohmic resistors, etc. may be electrically connected to the various electronic chips 102 and on the substrate 100. Another example for the passive components 122 are coils or inductances.

Together, the electronic chips 102 form a system control unit for controlling a connected system. For example, such a system may be electrically connected via a connector plug 104 which is, in turn, electrically connected to the substrate 100. The connected system may be an automotive system which can be connected to the device 300 via a cable tree or the like. For example, the system control unit in form of the cooperating electronic chips 102 may control an engine of a car such as a combustion engine or an electric engine of a vehicle or components thereof (for instance for controlling a door module). However, the controlled connected system may also be a machine tool such as a drilling machine, a riveter, a jack hammer or the like. Another connected system may be a battery loading system. The system control unit may also control an electric window lift or a centralized door locking system. It is however also possible that the system control unit controls, as connected system, a car lightning system, an infotainment system of a vehicle or a driver assistance system. In an embodiment, one of the electronic chips 102 is a microcontroller, wherein other ones of the electronic chips 102 may be power management chips (such as a power switch, for instance with a discrete or an integrated arrangement of circuit components).

Figure 2:
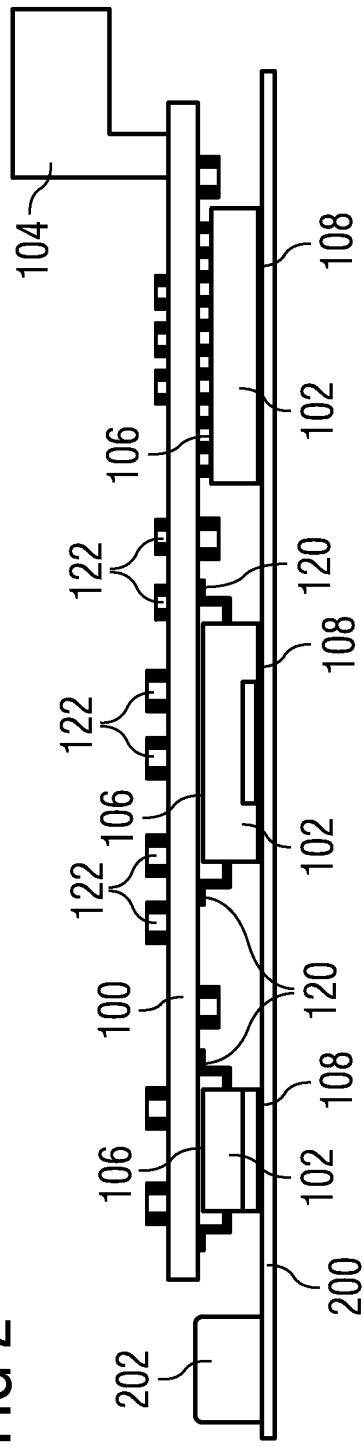

As can be taken from FIG. 2, a second main surface 108 of the electronic chips 102 is mechanically and thermally connected to a heat removal structure 200. The heat removal structure 200, which is here embodied as a planar metal plate (for instance made of copper or aluminum) serves for removing heat generated by the electronic chips 102 upon operation of the electronic device 300. In other words, when the electronic device 300 controls the connected system by means of the system control unit formed by the electronic chips 102, generated ohmic losses and the like can be dissipated from the electronic chips 102 by the heat removal structure 200 functioning as a cooling plate.

The electronic chips 102 and the heat removal plate 200 can be connected to one another by adhering, soldering, welding or by a hardenable mold.

Optionally, fins or blades (not shown) protruding over a surface of the heat removal structure 200 facing the second main surface 108 of the electronic chips 102 may be plastically deformed upon mounting by pressure applied when the heat removal structure 200 is pressed against the electronic chips 102. Therefore, height differences between different electronic chips 102 protruding over the substrate 100 up to different height levels may be equilibrated by the plastically deformable structures (such as fins or blades) which therefore contribute to the mechanical connection and may also serve for improving the thermal coupling between electronic chips 102 and the heat removal structure 200.

As schematically shown in FIG. 6, the heat removal structure 200 can also be configured as a (for instance metallic) grid (which may be punched from a plate or which may be wound by filaments) which can serve for a height equilibration or compensation upon pressing together such a heat removal structure 200 with the electronic chips 102. Embodying the heat removal structure 200 as a grid having an array of through holes also allows to further promote a rigid mechanical connection with mold material (which may be pressed between and into the through holes for an increase of the connection area), see FIG. 3. When the heat removal structure 200, for instance embodied as a cooling plate, is formed as a pattern grid, it is possible that a three-dimensional profile (for instance a mesh of microfins) is provided which may also equilibrate height differences among different electronic chips 102. The thermal and the mechanical integration need not be performed separately, but they can be joined in one process step. In this case, a three-dimensional profile can be very efficient.

As can be taken from FIG. 2 as well, the heat removal structure 200 furthermore has a mounting element 202 having, in this embodiment, a threaded blind hole (not shown) for connecting the electronic device 300 to a mounting base 400 of the connected system, see FIG. 4.

In order to obtain the electronic device 300 shown in FIG. 3, liquid or viscous mold material is deposited on the arrangement of FIG. 2 using the heat removal structure 200 as a support. By depositing the mold material and by subsequently hardening the same, it is possible to overmold and fully encapsulate the electronic chips 102 and the substrate 100 as well as the passive components 122 and the electric connections 120 by an overmolding structure 302. The liquid or viscous material forming the overmolding structure 302 also fills gaps between the described components and the heat removal structure 200 to thereby also contribute to a mechanical connection of all components of the electronic device 300. Also the electric connector 104 is partially embedded within the overmolding structure 302, whereas an electrically conductive connection portion of the electric connector 104 extends out of the overmolding structure 302. As can be taken from FIG. 3, the entire outer surface of the electronic device 300 is constituted by the overmolding structure 302, the heat removal structure 200 and the electric connector 104. No separate casing is required. As material for the overmolding structure 302, an epoxide resin, a thermoplast, a plastic material, if desired filled with filler particles, can be used. The formation of the overmolding structure 302 can be performed by injection molding, insert molding, or sputtering the mold material onto the arrangement of FIG. 2.

FIG. 4 shows the electronic device 300 after electric and mechanical connection to an automotive system.

As can be taken from FIG. 4, the electric connector 104 has been connected to the connected system (not shown) controlled by the electronic chips 102 of the electronic device 300 via an electric interface 402 and a cable 404.

Furthermore, a mechanical fixture 406, here embodied as a screw, may be screwed for providing a mechanical connection between a mounting base 400 of the automotive system, the heat removal structure 200 and the mounting element 202 to thereby provide for a screw connection between the electronic device 300 and the connected system. For this purpose, through holes are formed in the mounting base 400 and the heat removal structure 200. The thermal paths along which thermal energy is dissipated from the electronic chips 102 towards the environment are denoted with reference numeral 410 in FIG. 4.

It should furthermore be said that the connector 104 can be integrally formed with the substrate 100 or the heat removal structure 200 or may be provided, as shown in FIG. 4, as a separate component connected in this case to the substrate 100. Furthermore, it is possible that the connector 104 is specifically adapted for a plug connection with a connected system, such as a cable tree of a vehicle. Alternatively, it is possible that the cable 404 is directly connected to the substrate 100 to provide for a lightweight and simply constructed electronic device 300 with a direct cable connection in form of cable 404 directly connecting substrate 100 with the connected system. The mounting base 400 may for instance be a frame part (for example of a vehicle) or a car body panel.

FIG. 5 shows a cross-sectional view of an electronic device 300 according to an exemplary embodiment with a connector 104 which in this case does neither comprise the electronic interface 402 nor the cable 404. FIG. 6 is a corresponding plan view. As mentioned above, FIG. 6 schematically shows the heat removal structure 200 which is embodied as a grid.

FIG. 7 shows a cross-sectional view and FIG. 8 shows a corresponding plan view of an electronic device 300 according to yet another exemplary embodiment in which the connector plug 104 is substituted by a direct cable connection 404. In other words, the cable 404 has been connected to the substrate 100 directly by a solder structure 700 and has then been partially overmolded. Alternatively, the board connection can be realized with a simple connector like IDC-receptacles. Such a connector may be even simpler as it may be potted by the mold compound. Hence, instead of a direct solder connection, simple connectors can be used. This contact can be connected one time only (for instance wedge type) or releasable (for instance pin type connectors). Such kind of connector may be used for an integrated test of the connector and electric component before the process of overmolding.

In an embodiment of an electronic device 300 shown in FIG. 9 and FIG. 10, a double mechanical connection is provided to further increase stability. Hence, two mechanical connection elements 202 are provided at the heat removal structure 200 rather than one. Thus, the heat removal structure 200 here has two mounting elements 202, the electronic device 300 has two mechanical fixtures 406, and two through holes are formed in the mounting base 400 of the connected system.

In contrast to this, the embodiment of FIG. 11 and FIG. 12 only has one mechanical connection, i.e. only one mechanical connection element 202 and one mechanical fixture 406.

Figure 13:
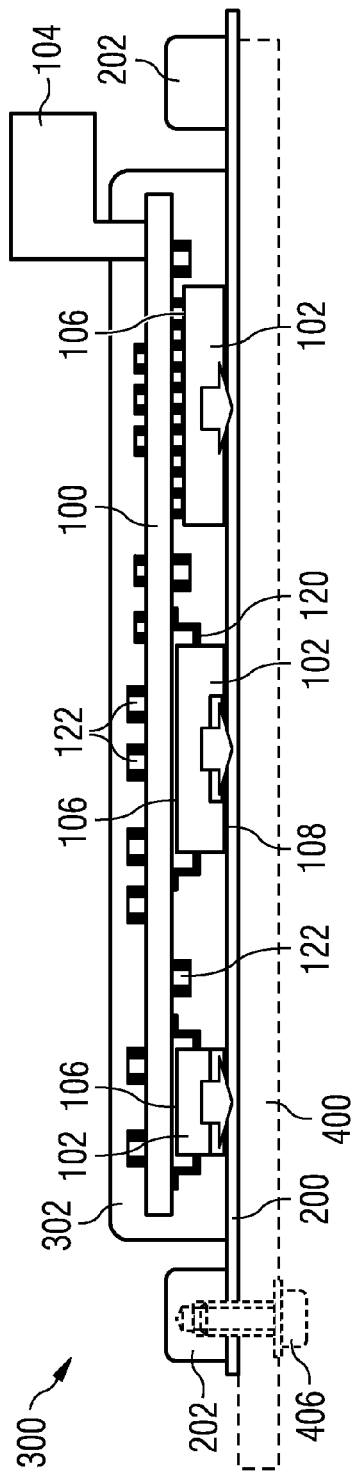
FIG. 13 shows a cross-sectional view and FIG. 14 shows a plan view of an electronic device according to yet another exemplary embodiment which differs from FIG. 5 and FIG. 6 concerning the provisions for mounting the electronic device on an appliance.
Figure 14:
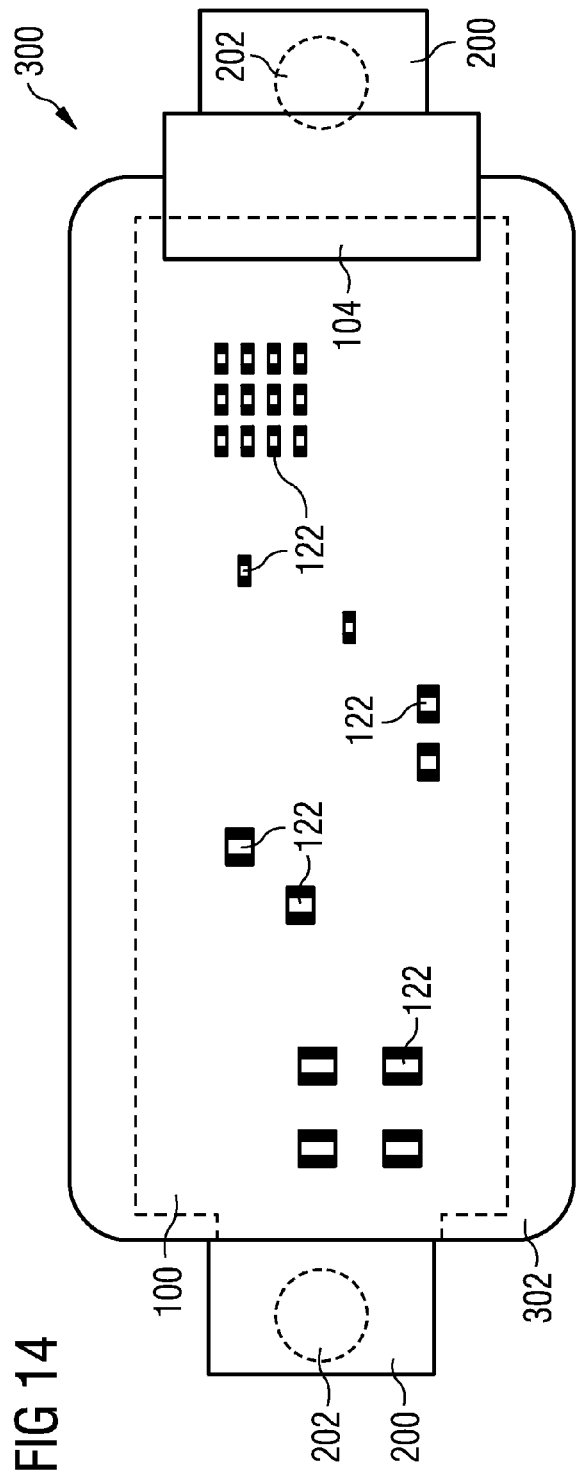

In the embodiment of FIG. 13 and FIG. 14, the mechanical connection elements 202—which are here provided on two opposing sides of the electronic device 300—are located outside of the overmold structure 302 so as to increase the exterior surface area of the electronic device 300 to additionally increase the efficiency of the heat removal.

In the embodiment of FIG. 15 and FIG. 16, clamping elements 1600 are provided on opposing ends of the electronic device 300 for clamping the electronic device 300 to a mounting base 400 such as a chassis.

In the embodiment of FIG. 17, a carrier 1700 (for instance of a vehicle) is shown, wherein the electronic device 300 is connected to this carrier 1700 at three screwing points so that three mechanical connection elements 202 are formed at the electronic device 300 in this embodiment.

In the embodiment of FIG. 18 and FIG. 19, the heat removal structure 200 is not configured as a completely planar plate but has a height profile with a local protrusion 1800 in a central portion of the heat removal structure 200 facing one of the electronic chips 102. By this local protrusion 1800 and the height profile of the heat removal structure 200, it is possible to manufacture an electronic device 300 for different component heights. In the shown embodiment, the smaller height of the central electronic device 102 as compared to the electronic chips 102 on the left hand side and on the right hand side can be compensated by the height profile of the heat removal structure 200.

In the embodiments of FIG. 1 to FIG. 19, both opposing main surfaces 106, 108 of the electronic chips 102 have been covered on one side with the substrate 100 and on the other side with the heat removal structure 200.

Figure 20:
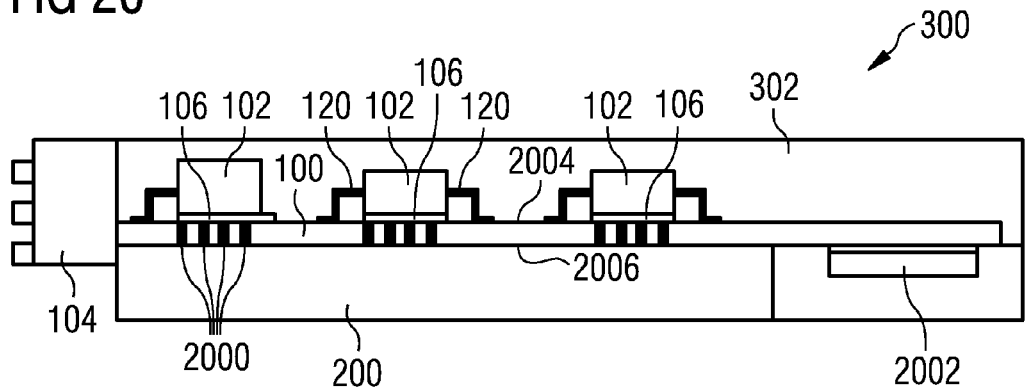
FIG. 20 shows a cross-sectional view of an electronic device according to an exemplary embodiment having an overmolded printed circuit board with a heat sink which is integrated during the overmolding.

In contrast to this, the embodiment of FIG. 20 shows an architecture in which the substrate 100 has a first main surface 2004 and an opposing second main surface 2006, wherein the electronic chips 102 are mounted on the first main surface 2004 and the heat removal structure 200 is mounted on the second main surface 2006 of the substrate 100. A microcontroller 2002 is shown as the only electronic chip of the embodiment of FIG. 20 which is mounted on the main surface 2006 on which also the heat removal structure 200 is mounted. Vias 2000 filled with an electrically and thermally conductive material such as copper connect the electronic chips 102 thermally with the heat removal structure 200.

Thus, a molded PCB in form of substrate 100 with proper thermal performance in form of an additional heat sink in form of the heat removal structure 200 is provided. In the embodiment of FIG. 20, the heat sink is integrated in the mold body, i.e. the overmold structure 302, to which the heat removal structure 200 is connected. The molded PCB and the heat sink cool the power components, i.e. the electronic chips 102 and the microcontroller 2002.

Figure 21:
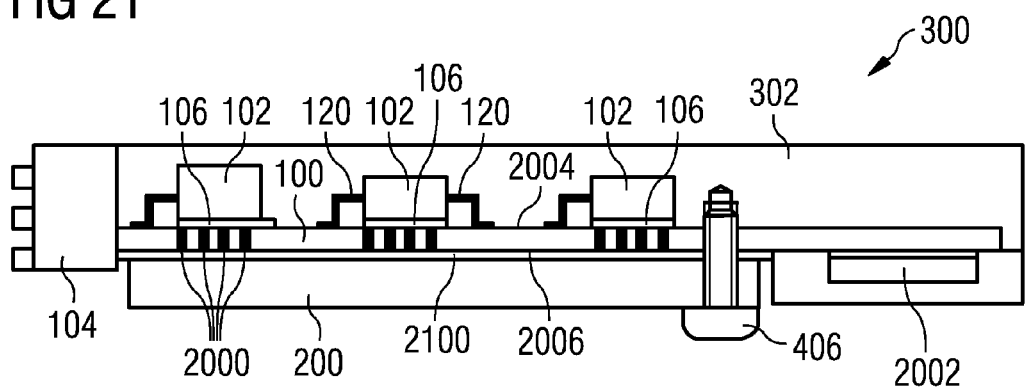
FIG. 21 shows a cross-sectional view of an electronic device according to another exemplary embodiment having an overmolded printed circuit board and a heat sink mounted to the overmolding structure and the printed circuit board after the overmolding.

In contrast to FIG. 20, the embodiment of FIG. 21 shows an electronic device 300 in which an externally assembled heat sink in form of the heat removal plate 200 is provided. A screw, rivet or other mechanical fixture 406 is used to connect the heat removal structure 200 with the substrate 100 and optionally with the overmold structure 302. A mold PCB and a heat sink are hence used to cool the power components. Additionally, an optional thin mold compound or thermal interfacial material 2100 is provided in the embodiment of FIG. 21.

Figure 22:
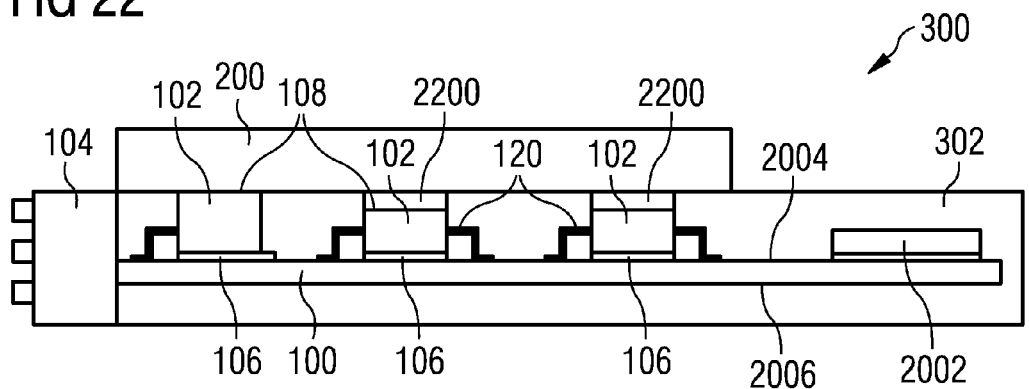
FIG. 22 shows a cross-sectional view of an electronic device according to yet another exemplary embodiment having an overmolded printed circuit board with a heat sink mounted after the overmolding.

FIG. 22 shows yet another exemplary embodiment in which, in a similar way as in FIG. 1 to FIG. 19, the substrate 100 is mounted on the first main surface 106 of the electronic chips 102, whereas the heat removal structure 200 is mounted on the opposing second main surface 108 of the electronic chips 102. Thermal interconnecting spacers 2200 compensate for a height distance between the electronic chips 102 and space the gap between the second main surfaces 108 of some of the electronic chips 102 and the planar heat removal structure 200 in form of an electrically conductive and thermally conductive metal plate.

It should be said that all figures are only draft examples where the dimensions in all directions may vary significantly. A change of device size parameters is possible. Different device fixtures may be used. The type, location and orientation of the connector (one or multiple connectors are possible) can also be different. The process flow may also be different to further improve the manufacturability. For example, the assembly of the connector might be performed in two procedures or at another point of the process flow.

FIG. 23 illustrates a cross-sectional view and FIG. 24 illustrates a plan view of an electronic device 300 according to another exemplary embodiment which comprises a two-component heat removal structure 200 formed of a heat removal pipe arrangement 2300 and an additional (flexible or here) ductile heat spreader 2302. Both the heat removal pipe arrangement 2300 and the heat spreader 2302 are located partially inside and partially outside of the overmolding structure 302. The heat spreader 2302 is sandwiched between the electronic chips 102 on the one hand and the heat removal pipe arrangement 2300 on the other hand to equilibrate height differences of different electronic chips 102 in view of its deformability. Externally of the overmolding structure 302, the heat spreader 2302 and the heat removal pipe arrangement 2300 are connected to one another and to a thermally conductive body 2304 via a fastening element 2306 such as a screw constituting an optional separate mechanical fixture. As can be taken particularly from FIG. 24, due to the ductile properties of the heat spreader 2302, the latter can be plastically deformed so that one main surface of the heat spreader 2302 can be brought in direct physical contact with the second mounting surfaces 108 of the electronic chips 102 (see contact areas 2400 in FIG. 24), thereby promoting a thermally conducting and heat removing function. An opposing other main surface of the heat spreader 2302 may be at least partially brought in direct physical contact with the heat removal pipe arrangement 2300 so as to further promote heat removal. This heat can be transported out of the overmolding structure 302 towards the thermally conductive body 2304 serving as an external heat sink. As a result of the flexible or ductile property of the heat spreader 2302, it can be converted from a planar default configuration into any desired user specific three-dimensional shape by (elastic or here) plastic deformation to contact a hot surface of a heat generating member to fulfill its function of heat removal by efficient heat conduction.

The heat spreader 2302 may for instance be made of a foil with metallic dust (such as copper dust) or of a metallic web or mesh (such as a copper mesh). In the embodiment of FIG. 23 and FIG. 24, the heat removal pipe arrangement 2300 is formed by two parallel beams of metallic material such as copper. The heat removal pipe arrangement 2300 may provide stability, the heat spreader 2302 (which may be mounted and supported by the heat removal pipe arrangement 2300) may render the heat removal structure 200 adjustable to different geometric boundary conditions.

FIG. 25 illustrates a cross-sectional view and FIG. 26 illustrates a plan view of an electronic device 300 according to another exemplary embodiment which is similar to the embodiment of FIG. 23 and FIG. 24. According to this embodiment, the heat spreader 2302 is however configured to be flexible and elastically deformable (for instance as a woven web of thermally conductive filaments such as copper wires) and does not protrude vertically over the heat removal pipe arrangement 2300 according to FIG. 25.

FIG. 27 illustrates a cross-sectional view and FIG. 28 illustrates a plan view of an electronic device 300 according to another exemplary embodiment which comprises a heat removal structure 200 formed of a heat removal frame 2700 and an additional (flexible or here) ductile heat spreader 2302. In the embodiment of FIG. 27 and FIG. 28, the heat removal frame 2700 is formed by a rigid annular frame enclosing and supporting the flexible or ductile heat spreader 2302. The heat removal frame 2700 may form a fixture for a metallic mesh—which may constitute the heat spreader 2302—during assembly of the heat spreader 2302.

FIG. 29 shows a cross-sectional view of an electronic device 300 according to an exemplary embodiment in which a heat removal structure 200 comprises a heat removal pipe arrangement 2300. According to this embodiment, the flexible or ductile heat spreader 2302 may be omitted or may be provided in a flexible form but does not protrude vertically over the heat removal pipe arrangement 2300. Alternatively, the heat removal pipe arrangement 2300 may be substituted by a rigid or by a (plastically or elastically) deformable grid of a thermally conductive material (such as a copper grid).

FIG. 30 shows a cross-sectional view of an electronic device 300 according to an exemplary embodiment in which a heat removal structure 200 comprises a heat removal pipe arrangement 2300 and a flexible foil or mesh of electrically conductive material constituting a flexible or ductile heat spreader 2302. According to this embodiment, the flexible or ductile heat spreader 2302 does not extend beyond the overmolding structure 302 but is completely encapsulated therewith.

FIG. 31 shows a cross-sectional view of an electronic device 300 according to an exemplary embodiment in which a heat removal structure 200 comprises a heat removal pipe arrangement 2300 and a flexible foil or mesh of electrically conductive material constituting a flexible or ductile heat spreader 2302. According to this embodiment, the flexible or ductile heat spreader 2302 does not extend beyond the overmolding structure 302 but is completely encapsulated therewith. The flexible or ductile heat spreader 2302 is only coupled thermally and mechanically to the heat removal pipe arrangement 2300 along a small overlapping portion, wherein the majority of the heat removal pipe arrangement 2300 is arranged outside of the overmolding structure 302.

It should be noted that the term "comprising" does not exclude other elements or features and the "a" or "an" does not exclude a plurality. Also elements described in association with different embodiments may be combined. It should also be noted that reference signs shall not be constructed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic device, comprising:
    a substrate;
    at least one electronic chip mounted on and electrically connected to the substrate and being configured as a system control unit for controlling a connected system;
    a heat removal structure thermally connected to the at least one electronic chip and configured for removing heat generated by the at least one electronic chip upon operation of the electronic device; and
    an overmolding structure configured for at least partially encapsulating the at least one electronic chip and the substrate;
    wherein the heat removal structure is configured as a thermally conductive grid having recesses being at least partially filled with material of the overmolding structure.

2. The device according to claim 1, wherein the substrate has a first main surface and a second main surface opposing the first main surface, wherein the at least one electronic chip is mounted on the first surface and the heat removal structure is mounted on the second surface.

3. The device according to claim 1, wherein the at least one electronic chip has a first main surface and a second main surface opposing the first main surface, wherein the at least one electronic chip is mounted with its first surface on the substrate and is mounted with its second surface on the heat removal structure.

4. The device according to claim 1, wherein the at least one electronic chip has a first main surface and a second main surface opposing the first main surface, wherein the at least one electronic chip is mounted with its first surface on the substrate, and the heat removal structure is mounted with a varying height on the second main surface of the at least one electronic chip.

5. The device according to claim 1, comprising an electric connector electrically coupled with the substrate, being partially covered by the overmolding structure but extending beyond the overmolding structure, and being configured for electrically connecting the device to a connection apparatus.

6. The device according to claim 5, wherein the electric connector comprises at least one of the group consisting of a cable, and a plug connector.

7. The device according to claim 1, comprising an electric connector electrically coupled with the substrate and being fully covered by the overmolding structure, wherein the device comprises one or more wired interconnects extending from the electric connector beyond the overmolding structure and being configured for electrically connecting the device to a connection apparatus.

8. The device according to claim 1, wherein the overmolding structure and the heat removal structure are configured for completely encapsulating at least the at least one electronic chip and the substrate so that both the at least one electronic chip and the substrate are circumferentially surrounded completely by the overmolding structure and the heat removal structure.

9. The device according to claim 1, comprising an electrical coupling structure configured for electrically coupling the substrate with the heat removal structure.

10. The device according to claim 1, wherein an external surface of the heat removal structure remains at least partially uncovered from the overmolding structure.

11. The device according to claim 1, wherein the overmolding structure and the heat removal structure form at least part of an exterior surface of the device.

12. The device according to claim 1, wherein the system control unit is configured for automotive applications, in particular for engine control.

13. The device according to claim 1, wherein the heat removal structure has a mechanical fastening provision configured for mechanically fastening the device to a mounting base of the connected system.

14. The device according to claim 1, wherein the system control unit is formed by a plurality of electronic chips having different height and being mounted on and electrically connected to the substrate, wherein at least one of the heat removal structure and the substrate has a mounting surface facing the plurality of electronic chips and having a height profile compensating for the different height of the plurality of electronic chips.

15. The device according to claim 1, wherein the heat removal structure is configured as a thermally conductive grid having recesses being at least partially filled with material of the overmolding structure.

16. The device according claim 1, wherein the heat removal structure is at least partially made of an elastically deformable or a plastically deformable material so that a height profile of the heat removal structure is adaptable during assembly of the device to compensate for level deviations.

17. The device according to claim 1, wherein the heat removal structure is ductile or flexible to compensate for different height caused by manufacturing tolerances and height dimensions of different electronic chips.

18. The device according to claim 1, wherein the heat removal structure comprises a rigid member and comprises an elastically or plastically deformable member connected to the rigid member.

19. An engine control module, comprising:
at least one semiconductor chip with a first main surface and a second main surface opposing the first main surface, wherein the at least one semiconductor chip is configured for performing an engine control function;
a printed circuit board to which the first surface of the at least one semiconductor chip is mounted and electrically connected;
a heat removal structure to which the second surface of the at least one semiconductor chip is mounted and thermally connected to the second surface of the at least one semiconductor chip, wherein the heat removal structure is configured for removing heat generated by the at least one semiconductor chip upon operation of the engine control module; and
an overmolding structure configured for at least partially encapsulating at least the at least one semiconductor chip and the printed circuit board;
wherein the heat removal structure is configured as a thermally conductive grid having recesses being at least partially filled with material of the overmolding structure.

* * * * *